US012755685B2

(12) United States Patent
Tian

(10) Patent No.: US 12,755,685 B2
(45) Date of Patent: Oct. 6, 2026

(54) DISPLAY PANEL AND DISPLAY DEVICE

(71) Applicant: Honor Device Co., Ltd., Shenzhen (CN)

(72) Inventor: Zheng Tian, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 401 days.

(21) Appl. No.: 18/557,808

(22) PCT Filed: Feb. 18, 2022

(86) PCT No.: PCT/CN2022/076737
§ 371 (c)(1),
(2) Date: Oct. 27, 2023

(87) PCT Pub. No.: WO2022/257496
PCT Pub. Date: Dec. 15, 2022

(65) Prior Publication Data

US 2024/0237444 A1 Jul. 11, 2024

(30) Foreign Application Priority Data

Jun. 9, 2021 (CN) ........................ 202110644637.4

(51) Int. Cl.
*H10K 59/131* (2023.01)
*G09G 3/3208* (2016.01)

(52) U.S. Cl.
CPC ......... *G09G 3/3208* (2013.01); *H10K 59/131* (2023.02)

(58) Field of Classification Search
CPC ......... G09G 3/3208; G09G 2300/0426; G09G 3/3266; G09G 3/3225; H10K 59/131
See application file for complete search history.

(56) References Cited

U.S. PATENT DOCUMENTS

| | | | |
|---|---|---|---|
| 10,373,986 | B2 | 8/2019 | Lai et al. |
| 10,627,683 | B2 | 4/2020 | Gao et al. |
| 10,720,606 | B2 | 7/2020 | Song et al. |
| 10,790,312 | B2 | 9/2020 | Qiao et al. |
| 11,723,238 | B2 | 8/2023 | Kim et al. |
| 11,864,436 | B2 | 1/2024 | Ochi et al. |
| 12,004,409 | B2 | 6/2024 | Tian |
| 2018/0166037 | A1 | 6/2018 | Lee et al. |

(Continued)

FOREIGN PATENT DOCUMENTS

| | | | |
|---|---|---|---|
| CN | 107561799 | A | 1/2018 |
| CN | 107611142 | A | 1/2018 |

(Continued)

*Primary Examiner* — Elias Ullah
(74) *Attorney, Agent, or Firm* — Conley Rose, P.C.

(57) ABSTRACT

A display panel and a display device. The display panel includes: a display region and a peripheral region that surrounds the display region. The display region includes a first edge to a fourth edge that are disposed opposite to each other. A corner between the first edge and the fourth edge is curved. The display region includes pixel units and R GOA signal lines. The peripheral region includes a GOA circuit, configured to drive the pixel units. The pixel units include M columns*N rows of light-emitting devices, M*N bottom drive circuits at lower layers of the light-emitting devices, and M*N anode leads connect the light-emitting devices to the bottom drive circuits, and R, M, and N are natural numbers.

21 Claims, 15 Drawing Sheets

(56) References Cited

U.S. PATENT DOCUMENTS

| | | | |
|---|---|---|---|
| 2019/0043892 | A1 | 2/2019 | Lee et al. |
| 2019/0312090 | A1 | 10/2019 | Park et al. |
| 2021/0064087 | A1 | 3/2021 | Ma et al. |
| 2021/0399080 | A1 | 12/2021 | Lee et al. |

FOREIGN PATENT DOCUMENTS

| | | | |
|---|---|---|---|
| CN | 108242217 | A | 7/2018 |
| CN | 108447392 | A | 8/2018 |
| CN | 108469706 | A | 8/2018 |
| CN | 108648695 | A | 10/2018 |
| CN | 109686243 | A | 4/2019 |
| CN | 111584552 | A | 8/2020 |
| CN | 111936951 | A | 11/2020 |
| CN | 112242424 | A | 1/2021 |
| CN | 112800702 | A | 5/2021 |
| CN | 112912947 | A | 6/2021 |
| CN | 112913029 | A | 6/2021 |
| EP | 4239621 | A1 | 9/2023 |
| TW | I645391 | B | 12/2018 |

DISPLAY PANEL AND DISPLAY DEVICE

CROSS-REFERENCE TO RELATED APPLICATIONS

This is a U.S. National Stage of International Application No. PCT/CN2022/076737 filed on Feb. 18, 2022, which claims priority to Chinese Patent Application No. 202110644637.4, filed with the China National Intellectual Property Administration on Jun. 9, 2021, both of which are incorporated herein by reference in their entireties.

TECHNICAL FIELD

This application relates to the field of terminal technologies, and in particular to a display panel and a display device.

BACKGROUND

With the rapid development of terminals such as smartphones, an increasing number of flexible displays are used in the terminals. The flexible display may be made into a foldable screen, a curved screen, a stretched screen, and a screen in another form due to variable and bendable characteristics. Currently, a "waterfall screen" on the market is characterized with that a left edge and a right edge are bent.

When four edges of the flexible display are bent, at a rounded (R) corner, that is, a junction of two adjacent curved surfaces, some film layers are accumulated due to uneven stress. As a result, wrinkles occur. To reduce the accumulation of the film layer, avoid the wrinkles, and beautify visual effect, a border frame at an R corner is to be narrowed.

How to narrow the border frame at the R corner is a key technical problem to be resolved. In a current circuit architecture, a signal line of a GOA circuit is disposed at the R corner. The signal line of the GOA circuit occupies space in the R corner. As a result, the border frame at the R corner is large and cannot be narrowed.

SUMMARY

Embodiments of this application provide a display panel and a display device. Bottom drive circuits in pixel units are reduced, and therefore areas of the bottom drive circuits are less than areas of light-emitting devices driven by the bottom drive circuits. In this way, a GOA signal line may pass through space reserved after the driver circuits are reduced. This avoids occupying space in an R corner, and further narrows a border frame at the R corner.

According to a first aspect, an embodiment of this application provides a display panel, applied to a terminal device having a display function. The display panel includes: a display region and a peripheral region that at least partially surrounds the display region. The display region includes a first edge, a second edge, a third edge, and a fourth edge. The first edge is disposed opposite to the second edge, the third edge is disposed opposite to the fourth edge, and a corner between the first edge and the fourth edge is curved. The display region includes a plurality of pixel units and R gate driver on array GOA signal lines that are arranged between the pixel units, and R is a natural number. The peripheral region includes a GOA circuit, and the GOA circuit is configured to drive the pixel units. The pixel units include M columns*N rows of light-emitting devices, M columns*N rows of bottom drive circuits, and M*N anode leads. The anode leads connect the light-emitting devices to the bottom drive circuits, the bottom drive circuits are disposed at lower layers of the light-emitting devices, and both M and N are natural numbers. An interval between adjacent light-emitting devices in the pixel unit is larger than a dimension of the bottom drive circuits corresponding to the adjacent light-emitting devices in the pixel unit, to enable a gap to exist between the pixel units. The R GOA signal lines are used to pass through gaps in the plurality of pixel units in the display region, and to connect a plurality of pixel units to the GOA circuits.

In this way, the bottom drive circuits are reduced, enabling the gap to exist between the pixel units. In addition, the GOA signal line may pass through the gap between the plurality of pixel units in the display region without occupying space in a corner region. This narrows a border frame at the R corner, beautifies visual effect, and avoids wrinkles. No new film layer is added due to the GOA signal line.

Optionally, a peripheral region corresponding to the first edge, the second edge, and the third edge includes all GOA circuits. Alternatively, a peripheral region corresponding to the first edge and the second edge includes all GOA circuits.

In this way, a peripheral region corresponding to the corner does not include the GOA circuit. This further narrows a width of peripheral region corresponding to the corner, and narrows a border frame at the corner.

Optionally, the light-emitting device includes a light-emitting region and a process redundancy region, and the interval is a distance, in a row direction, between geometrical centers of light-emitting regions in the adjacent light-emitting devices in the pixel unit.

Optionally, the GOA signal line includes a first part signal line and a second part signal line, and the first part signal line is connected to the second part signal line. The first part signal line extends in the row direction and passes through the gap between the pixel units. The second part signal line extends in a column direction and is connected to the GOA circuit.

In this way, the GOA signal lines may be arranged in a plurality of manners, and pass through the gaps between the pixel units without occupying space in the corner. Therefore, the corner is narrowed.

Optionally, there is an included angle of 90° between a straight line in which the first part signal line is located and a straight line in which the second part signal line is located.

Optionally, the plurality of pixel units are arranged in S rows, N is a multiple of 2, and R is equal to S*N.

Optionally, any one of the GOA signal lines passes through gaps between the plurality of pixel units in a pixel unit array in a Z shape, a Ω shape, a zigzag shape, or a curved shape.

The peripheral region includes a signal providing region, the signal providing region is adjacent to the fourth edge, and a length of the signal providing region is smaller than or equal to a length of the fourth edge. The display region further includes K data connection lines disposed between the pixel units, and K is a natural number. The K data connection lines are used to pass through the gaps between the plurality of pixel units in the display region, and to connect pixel units in Q columns in the plurality of pixel units to the signal providing region. The pixel units in Q columns includes pixel units corresponding to the corner, and Q is a natural number less than or equal to K.

In this way, a data connection line passes through the gaps between the plurality of pixel units in the display region without occupying space in a lower border frame. Therefore, the lower border frame is narrowed.

Optionally, the pixel units in Q columns further includes pixel units corresponding to the fourth edge.

In this way, the pixel units that are in the display region and that are not aligned with the signal providing region may also be connected by using the data connection line, to further narrow the lower border frame.

Optionally, any one of the data connection lines includes a first part connection line and a second part connection line, and the first part connection line is connected to the second part connection line. The first part connection line extends in the row direction and passes through the gap between the pixel units. The second part connection line extends in the column direction and is connected to the signal providing region.

In this way, the data connection lines may be arranged in a plurality of manners, and pass through the gaps between the pixel units without occupying space in the corner and the lower border frame. Therefore, the corner and the lower border frame are narrowed.

Optionally, there is an included angle of 90° between a straight line in which the first part connection line is located and a straight line in which the second part connection line is located.

Optionally, the plurality of pixel units are arranged in L columns, N is a multiple of 2, K is equal to Q*M, and the signal providing region includes L*M signal lines. The pixel units in Q columns extend through the K data connection lines and are connected to K signal lines. In the pixel units in L columns, pixel units in L columns to Q columns except the pixel units in Q columns extend in the column direction and are connected to L*M−K signal lines.

Optionally, the display region includes a second region and a first region disposed around a hole. The plurality of pixel units include a first pixel unit and a second pixel unit. The first region includes a plurality of first pixel units arranged in columns. The second region includes a plurality of second pixel units and T data lines arranged between the second pixel units in the second region, where T is a natural number. The plurality of first pixel units in the first region are connected in the column direction to corresponding columns of second pixel units in the second region. The T data lines are used to pass through gaps between the plurality of second pixel units in the second region, to connect second pixel units in U columns in the second region. The second pixel units in U columns include a plurality of columns of second pixel units whose holes are corresponding to the second region in the column direction, and U is a natural number less than or equal to T.

In this way, when pixel units corresponding to the holes in the column direction are connected, the data line passes through gaps between the second pixel units in the second region without occupying space in the second region. This improves transmittance of the second region.

Optionally, the hole is configured to dispose a lens of a camera, the first region is used to dispose a sensor of the camera, and the first region is a UDC region.

In this way, transmittance of the UDC region is improved, and shooting effect of the camera is improved.

Optionally, any one of the data lines includes a third part connection line, a fourth part connection line, and a fifth part connection line. The third part connection line, the fourth part connection line, and the fifth part connection line communicate with each other. Connection points between the third part connection line and light-emitting devices in any column are located on a first side of the hole, connection points between the fifth part connection line and the light-emitting devices in any column are located on a second side of the hole, and the first side is opposite to the second side. The third part connection line extends in the row direction and passes through gaps between the second pixel units in the second region, to connect the second part connection line. The fourth part connection line extends in the column direction and passes through the gaps between the second pixel units in the second region, to connect the third part connection line. The fifth part connection line extends in the row direction and passes through the gaps between the second pixel units in the second region.

In this way, the data lines may be arranged in a plurality of manners, and pass through the gaps between the second pixel units in the second region without occupying space in the first region. This improves transmittance of the first region.

Optionally, a straight line in which the third part connection line is located and a straight line in which the fourth part connection line is located are connected at an included angle of 90°, and the straight line in which the fourth part connection line is located and a straight line in which the fifth part connection line is located are connected at an included angle of 90°.

Optionally, N is a multiple of 2, and T is equal to U*M. The second pixel units in U columns are connected by using the T data lines. In second pixel units in L columns, second pixel units in L columns to U columns except the second pixel units in U columns extend and are connected in the column direction.

In this way, second pixel units corresponding to the holes in the column direction are connected by using data lines passing through the gaps between the second pixel units, and remaining second pixel units in the second region extend and are connected in the column direction.

Optionally, any one of the data lines passes through the gaps between the plurality of second pixel units in the second region in a Z shape, a Ω shape, a zigzag shape, or a curved shape.

Optionally, bottom drive circuits of the first pixel units in the first region are disposed in the peripheral region, light-emitting devices of the first pixel units in the first region are disposed in the first region, and the light-emitting devices of the first pixel units and the bottom drive circuits of the first pixel units are connected by using anode leads made of a transparent material.

In this way, the first region includes no bottom drive circuit, and the anode leads are made of a transparent material. This further improves the transmittance of the first region.

Optionally, the second pixel units in U columns further include a plurality of columns of second pixel units that are in the first region and that are corresponding to the second region in the column direction.

In this way, data lines of the plurality of columns of the second pixel units corresponding to the first region in the column direction pass through the gaps between the second pixel units without occupying the space in the first region. This improves the transmittance of the first region.

Optionally, bottom drive circuits of the first pixel units in the first region are disposed in some of second pixel units in the first region, light-emitting devices of the first pixel units in the first region are disposed in the first region, and the light-emitting devices of the first pixel units and the bottom drive circuits of the first pixel units are connected by using anode leads made of a transparent material.

In this way, the first region includes no bottom drive circuit, and the anode leads are made of a transparent material. This further improves transmittance of the first region.

Optionally, a width of the peripheral region at the corner is smaller than a width of the peripheral region at the first edge.

According to a second aspect, an embodiment of this application provides a display panel, applied to a terminal device having a display function. A display panel includes: a display region and a peripheral region that at least partially surrounds the display region. The display region includes a first edge, a second edge, a third edge, and a fourth edge, the first edge is disposed opposite to the second edge, the third edge is disposed opposite to the fourth edge, and a corner between the first edge and the fourth edge is curved. The display region includes a plurality of pixel units and R gate driver on array GOA signal lines that are arranged between the pixel units, and R is a natural number. The peripheral region includes a GOA circuit, and the GOA circuit is configured to drive the pixel units. The pixel units include M columns*N rows of light-emitting devices. M columns*N rows of bottom drive circuits, and M*N anode leads, the anode leads connect the light-emitting devices to the bottom drive circuits, the bottom drive circuits are disposed at lower layers of the light-emitting devices, and both M and N are natural numbers. A dimension of a region enclosed by the light-emitting devices in the pixel units is larger than a dimension of a region enclosed by bottom drive circuits corresponding to the light-emitting devices in the pixel units, to enable a gap to exist between the pixel units. The R GOA signal lines are used to pass through the gaps between the plurality of pixel units in the display region, and to connect the pixel unit to the GOA circuit.

In this way, the bottom drive circuits are reduced, enabling the gap to exist between the pixel units. In addition, the GOA signal line may pass through the gap between the plurality of pixel units in the display region without occupying space in a corner region. This narrows a border frame at the R corner.

Optionally, a peripheral region corresponding to the first edge, the second edge, and the third edge includes all GOA circuits. Alternatively, a peripheral region corresponding to the first edge and the second edge includes all GOA circuits.

In this way, a peripheral region corresponding to the corner does not include the GOA circuit. This further narrows a width of peripheral region corresponding to the corner, and narrows a border frame at the corner.

Optionally, the GOA signal line includes a first part signal line and a second part signal line, and the first part signal line is connected to the second part signal line. The first part signal line extends in the row direction and passes through the gap between the pixel units. The second part signal line extends in a column direction and is connected to the GOA circuit.

In this way, the GOA signal lines may be arranged in a plurality of manners, and pass through the gaps between the pixel units without occupying space in the corner. Therefore, the corner is narrowed.

Optionally, there is an included angle of 90° between a straight line in which the first part signal line is located and a straight line in which the second part signal line is located.

Optionally, the plurality of pixel units are arranged in S rows, N is a multiple of 2, and R is equal to S*N.

Optionally, any one of the GOA signal lines passes through gaps between the plurality of pixel units in a pixel unit array in a Z shape, a Ω shape, a zigzag shape, or a curved shape.

The peripheral region includes a signal providing region, the signal providing region is adjacent to the fourth edge, and a length of the signal providing region is smaller than or equal to a length of the fourth edge. The display region further includes K data connection lines disposed between the pixel units, and K is a natural number. The K data connection lines are used to pass through the gaps between the plurality of pixel units in the display region, and to connect pixel units in Q columns in the plurality of pixel units to the signal providing region. The pixel units in Q columns includes pixel units corresponding to the corner, and Q is a natural number less than or equal to K.

In this way, a data connection line passes through the gaps between the plurality of pixel units in the display region without occupying space in a lower border frame. Therefore, the lower border frame is narrowed.

Optionally, the pixel units in Q columns further includes pixel units corresponding to the fourth edge.

In this way, the pixel units that are in the display region and that are not aligned with the signal providing region may also be connected by using the data connection line, to further narrow the lower border frame.

Optionally, any one of the data connection lines includes a first part connection line and a second part connection line, and the first part connection line is connected to the second part connection line. The first part connection line extends in the row direction and passes through the gap between the pixel units. The second part connection line extends in the column direction and is connected to the signal providing region.

In this way, the data connection lines may be arranged in a plurality of manners, and pass through the gaps between the pixel units without occupying space in the corner and the lower border frame. Therefore, the corner and the lower border frame are narrowed.

Optionally, there is an included angle of 90° between a straight line in which the first part connection line is located and a straight line in which the second part connection line is located.

Optionally, the plurality of pixel units are arranged in L columns, N is a multiple of 2, K is equal to Q*M, and the signal providing region includes L*M signal lines. The pixel units in Q columns extend through the K data connection lines and are connected to K signal lines. In the pixel units in L columns, pixel units in L columns to Q columns except the pixel units in Q columns extend in the column direction and are connected to L*M−K signal lines.

Optionally, the display region includes a second region and a first region disposed around a hole. The plurality of pixel units include a first pixel unit and a second pixel unit. The first region includes a plurality of first pixel units arranged in columns. The second region includes a plurality of second pixel units and T data lines arranged between the second pixel units in the second region, where T is a natural number. The plurality of first pixel units in the first region are connected in the column direction to corresponding columns of second pixel units in the second region. The T data lines are used to pass through gaps between the plurality of second pixel units in the second region, to connect second pixel units in U columns in the second region. The second pixel units in U columns include a plurality of columns of second pixel units whose holes are corresponding to the second region in the column direction, and U is a natural number less than or equal to T.

In this way, when pixel units corresponding to the holes in the column direction are connected, the data line passes through gaps between the second pixel units in the second region without occupying space in the second region. This improves transmittance of the second region.

Optionally, the hole is configured to dispose a lens of a camera, the first region is used to dispose a sensor of the camera, and the first region is a UDC region.

In this way, transmittance of the UDC region is improved, and shooting effect of the camera is improved.

Optionally, any one of the data lines includes a third part connection line, a fourth part connection line, and a fifth part connection line. The third part connection line, the fourth part connection line, and the fifth part connection line communicate with each other. Connection points between the third part connection line and light-emitting devices in any column are located on a first side of the hole, connection points between the fifth part connection line and the light-emitting devices in any column are located on a second side of the hole, and the first side is opposite to the second side. The third part connection line extends in the row direction and passes through gaps between the second pixel units in the second region, to connect the second part connection line. The fourth part connection line extends in the column direction and passes through the gaps between the second pixel units in the second region, to connect the third part connection line. The fifth part connection line extends in the row direction and passes through the gaps between the second pixel units in the second region.

In this way, the data lines may be arranged in a plurality of manners, and pass through the gaps between the second pixel units in the second region without occupying space in the first region. This improves transmittance of the first region.

Optionally, a straight line in which the third part connection line is located and a straight line in which the fourth part connection line is located are connected at an included angle of 90°, and the straight line in which the fourth part connection line is located and a straight line in which the fifth part connection line is located are connected at an included angle of 90°.

Optionally, N is a multiple of 2, and T is equal to U*M. The second pixel units in U columns are connected by using the T data lines. In second pixel units in L columns, second pixel units in L columns to U columns except the second pixel units in U columns extend and are connected in the column direction.

In this way, second pixel units corresponding to the holes in the column direction are connected by using data lines passing through the gaps between the second pixel units, and remaining second pixel units in the second region extend and are connected in the column direction.

Optionally, any one of the data lines passes through the gaps between the plurality of second pixel units in the second region in a Z shape, a Ω shape, a zigzag shape, or a curved shape.

Optionally, bottom drive circuits of the first pixel units in the first region are disposed in the peripheral region, light-emitting devices of the first pixel units in the first region are disposed in the first region, and the light-emitting devices of the first pixel units and the bottom drive circuits of the first pixel units are connected by using anode leads made of a transparent material.

In this way, the first region includes no bottom drive circuit, and the anode leads are made of a transparent material. This further improves the transmittance of the first region.

Optionally, the second pixel units in U columns further include a plurality of columns of second pixel units that are in the first region and that are corresponding to the second region in the column direction.

In this way, data lines of the plurality of columns of the second pixel units corresponding to the first region in the column direction pass through the gaps between the second pixel units without occupying the space in the first region. This improves the transmittance of the first region.

Optionally, bottom drive circuits of the first pixel units in the first region are disposed in some of second pixel units in the first region, light-emitting devices of the first pixel units in the first region are disposed in the first region, and the light-emitting devices of the first pixel units and the bottom drive circuits of the first pixel units are connected by using anode leads made of a transparent material.

In this way, the first region includes no bottom drive circuit, and the anode leads are made of a transparent material. This further improves transmittance of the first region.

Optionally, a width of the peripheral region at the corner is smaller than a width of the peripheral region at the first edge.

According to a third aspect, an embodiment of this application provides a display, including the display panel according to the first aspect or the second aspect, where the display panel is configured to display an image.

For beneficial effects brought by the display provided in the third aspect and the possible designs of the third aspect, refer to beneficial effects brought by the display panel provided in the first aspect and the possible designs of the first aspect. Details are not described herein again.

According to a fourth aspect, an embodiment of this application provides a display device, including the display according to the third aspect. The display is configured to display an image.

For beneficial effects brought by the display device provided in the fourth aspect and the possible designs of the fourth aspect, refer to beneficial effects brought by the display panel provided in the first aspect and the possible designs of the first aspect. Details are not described herein again.

DESCRIPTION OF EMBODIMENTS

Figure 1:
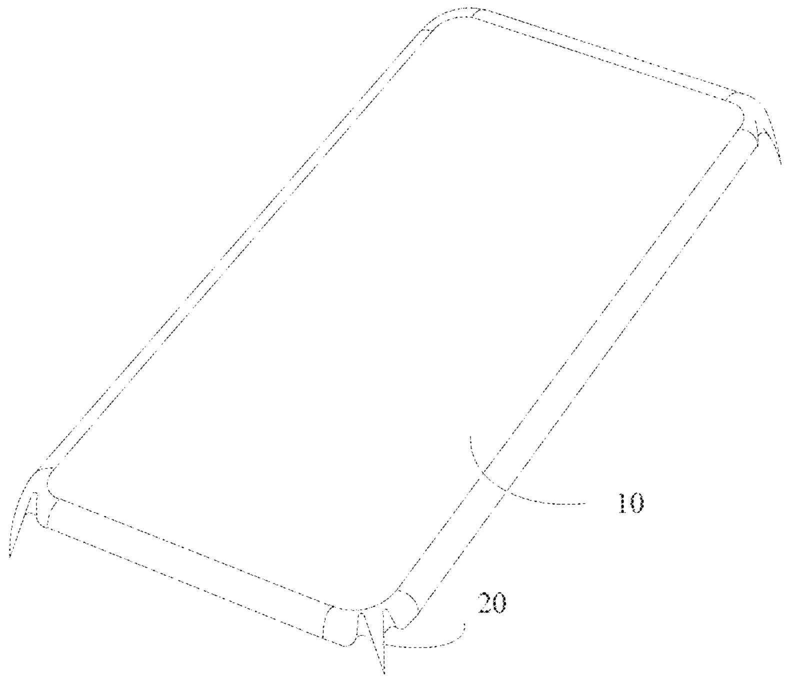
FIG. 1 is a schematic diagram of a three-dimensional structure of a flexible display according to a possible implementation.

To clearly describe the technical solutions in embodiments of this application, terms such as "first" and "second" are used in embodiments of this application to distinguish between same items or similar items that provide basically same functions or purposes. For example, a first device and a second device are merely used to distinguish between different devices, and are not intended to limit a sequence thereof. A person skilled in the art may understand that the words such as "first" and "second" do not limit a quantity or an execution sequence, and the words such as "first" and "second" do not indicate a definite difference.

It should be noted that, in this application, a word such as "example" or "for example" is used to represent giving an example, an illustration, or a description. Any embodiment or design solution described as an "example" or "for example" in this application should not be explained as being more preferred or having more advantages than other embodiments or design solutions. To be precise, the word such as "example" or "for example" is intended to present a related concept in a specific manner.

It should be noted that, the network architecture and the service scenarios described in embodiments of this application are to more clearly describe the technical solutions of embodiments of this application. They do not constitute any limitation on the technical solutions provided in embodiments of this application. A person of ordinary skill in the art knows that with the evolution of the network architecture and the emergence of new service scenarios, the technical solutions provided in embodiments of this application are also applicable to resolve similar technical problems.

It should be noted that, in embodiments of this application, a word such as "example" or "for example" is used to represent giving an example, an illustration, or a description. Any embodiment or design solution described as an "example" or "for example" in embodiments of this application should not be explained as being more preferred or having more advantages than other embodiments or design solutions. To be precise, the word such as "example" or "for example" is intended to present a related concept in a specific manner.

It should be noted that, in embodiments of this application, "include" and/or "contain" specify/specifies existence of stated features or elements, but do/does not exclude existence or addition of one or more other features or elements. On the contrary, "consist of" specifies existence of stated features or elements and excludes existence of other features or elements.

Further, when a layer, a region, or an element is referred to as "being" located "on" another layer, another area, or another element, it indicates that the laver, the area, or the element is directly or indirectly located on the another layer, the another area, or the another element. For example, there may be an intermediate layer, an intermediate region, or an intermediate element.

For ease of description, a dimension of an element in the accompanying drawings may be exaggerated or reduced. Therefore, although a relative dimension and angle of the element shown in the accompanying drawings may indicate at least one example embodiment of the present disclosure, there may be other example embodiments of the present disclosure having a relative dimension and angle different from the shown relative dimension and angle.

When a wiring is referred to as "extending in a first direction or a second direction", it indicates that the wiring may extend not only in a linear shape, but also in a zigzag or curved shape in the first direction or the second direction. In addition, when it is said that a wiring or an element extends in a specific direction, it indicates that the wiring or the element extends mainly in the specific direction. For example, the wiring or the element extends farther in the specific direction than in any other direction.

In embodiments of this application. "in a plan view" means a diagram of a target part viewed from above, and "in a cross-sectional view" means a vertical cross-sectional view of the target part viewed from a side. Unless otherwise defined, the term "overlap" includes overlapping "in a plan view" and "in a cross-sectional view". Unless otherwise defined, the signals described in this specification are generic terms for voltage or current.

With the rapid development of terminals such as smartphones, an increasing number of flexible displays are used in the terminals. The flexible display has variable and bendable characteristics, and has a characteristic of low power consumption because an organic light-emitting diode (organic light-emitting diode, OLED) technology is used for the flexible display.

When four edges of the flexible display are bent, at four R corners, some film layers are accumulated due to uneven stress. As a result, wrinkles occur. For example, FIG. 1 is a schematic diagram of a three-dimensional structure of a flexible display according to a possible implementation. When a quad-curved display, that is, a display with bent parts on all four sides, is manufactured, at a junction of adjacent sides of a flexible display 10, wrinkles 20 occur due to accumulation of film layers of the display. The wrinkles 20 not only affect effect of attaching the flexible display 10 to other parts of a mobile phone such as a glass backplane, but also cause adverse effect on display performance of the flexible display 10.

To avoid the wrinkles and beautify visual effect, a border frame at an R corner of the display is to be narrowed. The display panel is an important component of the display. When the border frame at the R corner in the display panel is narrowed, a corresponding border frame at the R corner in the display is narrowed.

Figure 2:
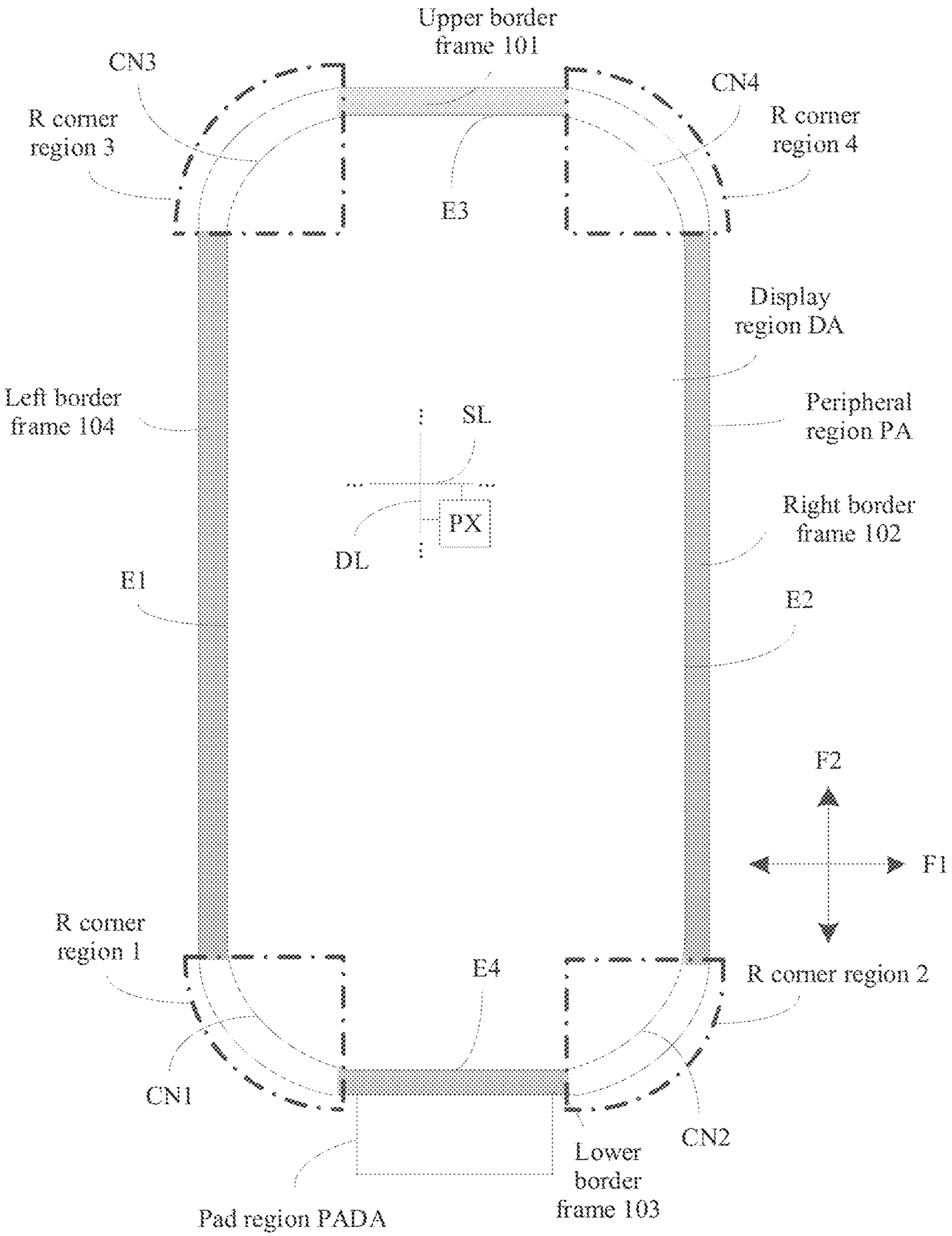
FIG. 2 is a schematic diagram of a structure of a display device according to a possible implementation.
Figure 3:
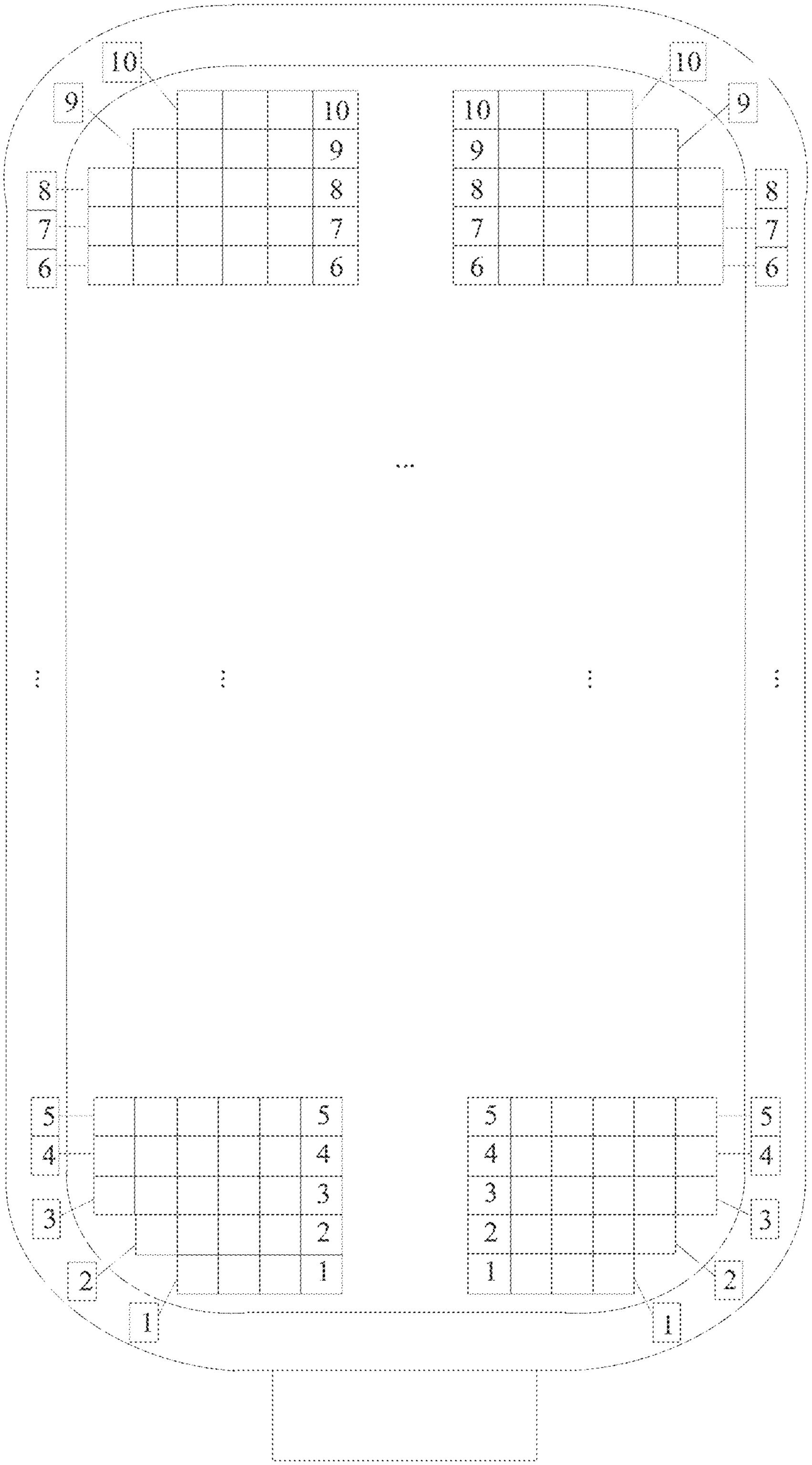
FIG. 3 is a schematic diagram of a structure of a display circuit according to a possible implementation.

To facilitate understanding of a display panel provided in embodiments of this application, the following describes a structure of the display panel in possible implementations with reference to FIG. 2 and FIG. 3.

FIG. 2 is a schematic plane view of a display panel according to a possible implementation. The display panel includes a display region DA and a peripheral region PA. The peripheral region PA is located outside the display region DA, and at least partially surrounds the display region DA.

The display region DA is used to display an image. Edges of the display region DA may form a right angle. As shown in FIG. 2, a first corner CN1 at an edge of the display region DA may have a circular shape. Specifically, the display region DA may include a first edge E1 and a second edge E2 that are disposed opposite to each other, and a third edge E3 and a fourth edge E4 that are located between the first edge E1 and the second edge E2 and that are disposed opposite to each other. The first edge E1 and the fourth edge E4 may be connected by using a first corner CN1 having a circular shape, and the second edge E2 and the fourth edge E4 may be connected by using a second corner CN2 having a circular shape. The first edge E1 and the third edge E3 may be connected by using a third corner CN3 having a circular shape, and the second edge E2 and the third edge E3 may be connected by using a fourth corner CN4 having a circular shape.

It may be understood that a part of a display region DA and a part of a border frame region PA that are corresponding to the first corner CN1 in the display panel shown in FIG. 2 may be referred to as an R corner region 1. A part of a display region DA and a part of a border frame region PA that are corresponding to the second corner CN2 may be referred to as an R corner region 2. A part of a display region DA and a part of a border frame region PA that are corresponding to the third corner CN3 may be referred to as an R corner region 3. A part of a display region DA and a part of a border frame region PA that are corresponding to the fourth corner CN4 may be referred to as an R corner region 4.

The display region DA includes a plurality of pixel units PX and wirings that can apply an electrical signal to the plurality of pixel units PX.

Each of the plurality of pixel units PX may include a light-emitting device and a circuit part configured to drive the light-emitting device. For example, the light-emitting device may be an organic light-emitting diode, and the circuit part may include a plurality of transistors, capacitors, and the like.

The wirings that can apply an electrical signal to the plurality of pixel units PX may include a plurality of scanning lines SL, a plurality of data lines DL, and the like. Each of the plurality of scanning lines SL may extend in a first direction D1, and each of the plurality of data lines DL may extend in a second direction D2. The plurality of scanning lines SL, for example, may be disposed in a plurality of rows to transmit a scanning signal to the pixel PX, and the plurality of data lines DL may be disposed in a plurality of columns to transmit a data signal to the pixel PX. Each of the plurality of pixel units PX may be connected to a corresponding scanning line SL in the plurality of scanning lines SL and a corresponding data line DL in the plurality of data lines DL.

The peripheral region PA may at least partially surround the display region DA. A peripheral region PA in which the pixel unit PX is not disposed may be simply divided into a border frame region adjacent to the display region DA and a pad region PADA.

For ease of description, in this embodiment of this application, the border frame region is divided into an upper border frame region 101, a right border frame region 102, a lower border frame region 103, a left border frame region 104, a border frame region corresponding to the first corner CN1, a border frame region corresponding to the second corner CN2, a border frame region corresponding to the third corner CN3, and a border frame region corresponding to the fourth corner CN4.

It may be understood that the upper border frame region 101 is a peripheral region corresponding to a third edge: the right border frame region 102 is a peripheral region corresponding to a second edge; the lower border frame region 103 is a peripheral region corresponding to a fourth edge: the left border frame region 104 is a peripheral region corresponding to a first edge; the border frame region corresponding to the first corner CN1 may also be referred to as a peripheral region corresponding to the first corner CN1; the border frame region corresponding to the second corner CN2 may also be referred to as a peripheral region corresponding to the second corner CN2; the border frame region corresponding to the third corner CN3 may also be referred to as a peripheral region corresponding to the third corner CN3; and the border frame region corresponding to the fourth corner CN4 may also be referred to as a peripheral region corresponding to the fourth corner CN4.

It should be noted that the upper border frame region 101, the right border frame region 102, and the left border frame region 104 each include a VSS signal providing region, a protection and detection region, and a Dam region.

The VSS signal providing region is used to output a cathode signal for the display region DA. Specifically, a circuit of the VSS signal providing region is connected to a cathode of a pixel unit PX, to provide the cathode signal to the pixel unit PX.

The protection and detection region is used to protect and detect the panel. The protection and detection region includes, but is not limited to, a panel crack detection (panel crack detection, PCD) circuit and an isolation column. The isolation column is used to isolate water, oxygen, and the like in the air, to avoid water absorption by an organic material in the display panel.

The Dam region includes a Dam packaging unit. The Dam packaging unit is configured to isolate water, oxygen, and the like in the air, to avoid water absorption by the organic material in the display panel.

The right border frame region 102 and the left border frame region 104 each further include a GOA region. The GOA region is used to drive the pixel unit PX to display an image. The GOA region includes a GOA circuit. The GOA circuit may include a scan driver SDV, an emit driver EDV, and/or the like. The scan driver SDV is configured to supply one or more electrical signals, such as a scanning signal, to a plurality of pixel units PX along a signal line such as the scanning line SL. The emit driver EDV is configured to supply one or more electrical signals, such as an emitting control signal, to the pixel units PX along a signal line such as an emitting control line.

The lower border frame region 103 includes a power supply lead and a signal line from an integrated circuit IC. The power supply lead is used to supply power to the display region DA. The signal line from an integrated circuit IC is used to transmit the data signal to the pixel unit PX, control the pixel unit PX to emit light, and further control display of the display region DA.

The border frame region corresponding to the first corner CN1, the border frame region corresponding to the second corner CN2, the border frame region corresponding to the third corner CN3, and the border frame region corresponding to the fourth corner CN4 each include the GOA circuit, the VSS signal providing region, the protection and detection region, and the Dam region.

The pad region PADA is a region in which various electronic devices, printed circuit boards, or the like are electrically attached. A plurality of pads in the pad region PADA may be electrically connected to a data driver. For example, the pad region PADA includes a signal providing region. The signal providing region is used to transmit the data signal to the pixel unit PX.

For example, FIG. 3 is a schematic plane view of an arrangement of GOA circuits corresponding to FIG. 2. As shown in FIG. 3, the GOA circuits are separately disposed in the left border frame region, the right border frame region, the border frame region corresponding to the first corner CN1, the border frame region corresponding to the second corner CN2, the border frame region corresponding to the third corner CN3, and the border frame region corresponding to the fourth corner CN4.

It should be noted that, pixel units PX in the display panel shown in FIG. 3 are driven on both sides, and pixel units PX in each row are correspondingly connected to GOA circuits on both sides through GOA signal lines. The GOA circuits on both sides of the pixel units PX are arranged in a same or similar manner. A GOA circuit on one side of the pixel units PX is described in this embodiment of this application, and a GOA circuit on the other side of the pixel units PX is not described herein.

The following describes an arrangement of the GOA circuit on a right side of the pixel unit PX. FIG. 3 shows an example of ten rows of pixel units PX and corresponding GOA circuits. As shown in FIG. 3, pixel units PX in a first row to a tenth row are sequentially disposed from bottom to top in a display region DA, and a first GOA circuit to a tenth GOA circuit are sequentially disposed from the bottom up in a corresponding peripheral region PA.

Some pixel units PX in the first row to the third row are located in the R corner region 2, and correspondingly, the first GOA circuit to the third GOA circuit are located in the R corner region 2. The fourth GOA circuit to the eighth GOA circuit corresponding to pixel units PX in the fourth row to the eighth row are located in the right border frame region. Some pixel units PX in the ninth row and the tenth row are located in the R corner region 4, and correspondingly, the ninth GOA circuit and the tenth GOA circuit are located in the R corner region 4.

Figure 4:
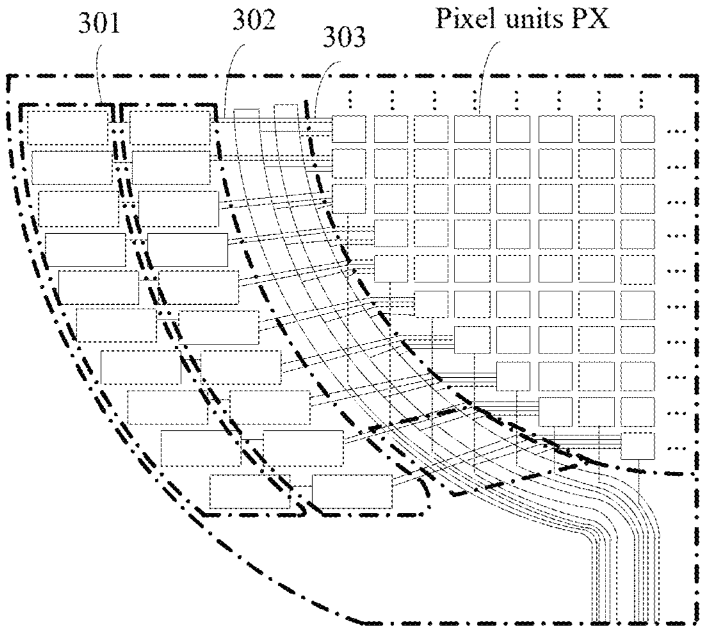
FIG. 4 is a schematic diagram of a structure of a display circuit at an R corner according to a possible implementation.

FIG. 4 is a schematic plane view of an enlarged structure of an R corner region 1 shown in FIG. 3. As shown in FIG. 4, an R corner region 1 includes pixel units PX, GOA circuits 301. GOA signal lines 302, and GOA output lines 303. The GOA output line 203 is a lead (for example, a scanning line, an emitting control line, or the like) that is connected to a row of the pixel units PX. The GOA output line 303 is located in the display region.

In the display panel shown in FIG. 3 and FIG. 4, the GOA circuit and a signal line of the GOA circuit occupy space in the R corner region. As a result, the border frame in the R corner region is large and cannot be narrowed.

Figure 5:
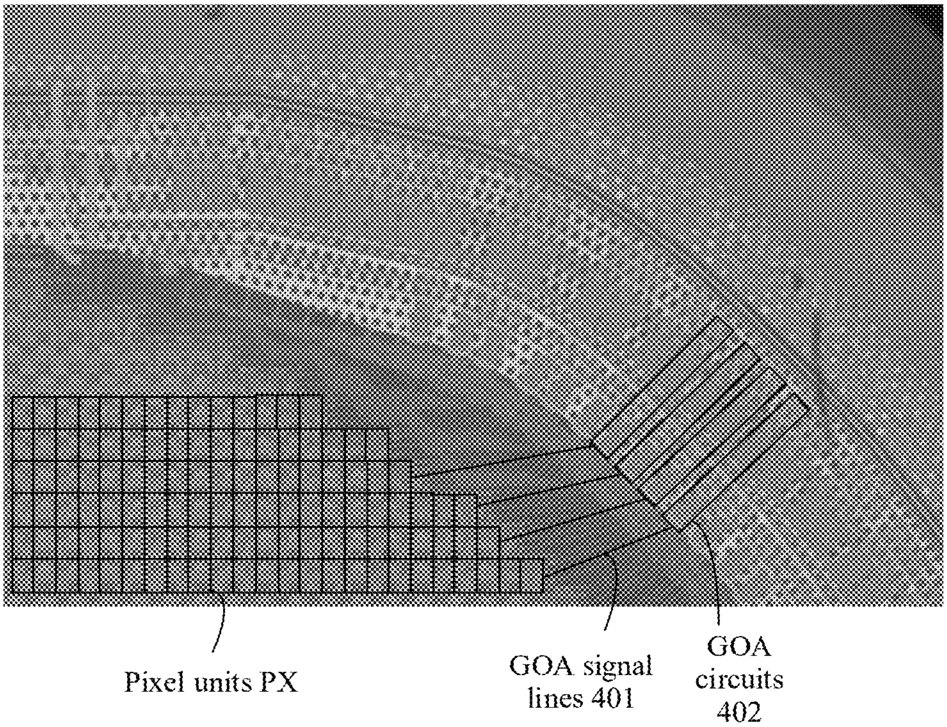
FIG. 5 is a schematic diagram of a structure of a display device according to a possible implementation.

FIG. 5 is a schematic diagram of a part of a display panel in a possible implementation. As shown in FIG. 5, a corner region of the display panel includes pixel unit PXs. GOA signal lines 401, and GOA circuits 402. The GOA circuits 402 and the GOA signal lines 401 occupy space in an R corner.

Figure 6:
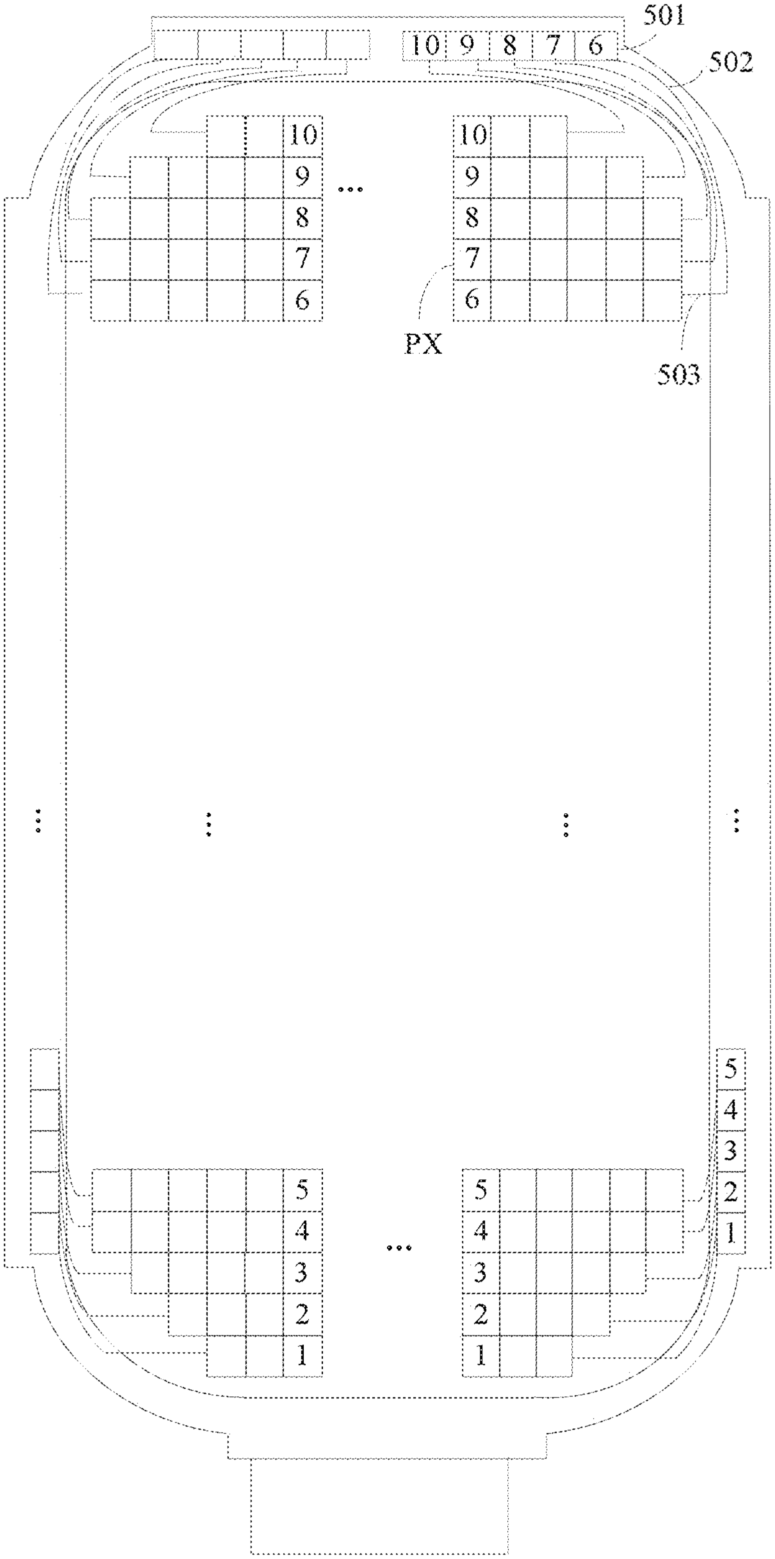
FIG. 6 is a schematic diagram of a structure of a display device according to a possible implementation.

FIG. 6 is a schematic plane view of an arrangement of GOA circuits according to an embodiment of this application. As shown in FIG. 6, GOA circuits 501 are respectively disposed in a left border frame region, a right border frame region, and an upper border frame region. The GOA circuit 501 is connected to a pixel unit PX through a GOA signal line 502 and a GOA output line 503. FIG. 6 shows an example of ten rows of pixel units PX and corresponding GOA circuits. As shown in FIG. 6, pixel units PX in a first row to a tenth row are sequentially disposed from bottom up in a display region DA, and a first GOA circuit to a tenth GOA circuit are sequentially disposed from bottom up in a corresponding peripheral region PA.

Specifically, some pixel units PX in the first row to the third row are located in an R corner region 2, and correspondingly, the first GOA circuit to the third GOA circuit are located in the right border frame region. The fourth GOA circuit to the eighth GOA circuit corresponding to pixel units PX in the fourth row to the eighth row sequentially move upward. When the GOA circuit moves upward to the R corner region, the GOA circuit moves to the upper border frame region. The fourth GOA circuit and the fifth GOA circuit corresponding to pixel units PX in the fourth row and the fifth row are located in the right border frame region. The sixth GOA circuit to the eighth GOA circuit corresponding to pixel units PX in the sixth row to the eighth row are located in the upper border frame region. Some pixel units PX in the ninth row and the tenth row are located in an R corner region 4, and correspondingly, the ninth GOA circuit and the tenth GOA circuit are in the upper border frame region.

Compared with the GOA circuits shown in FIG. 3, the GOA circuits shown in FIG. 6 sequentially move upward. When the left border frame region and the right border frame region do not accommodate some GOA circuits, the some GOA circuits are disposed in the upper border frame region.

In a possible implementation, a GOA circuit connected to a first pixel unit is disposed in a peripheral region corresponding to a third edge, and a GOA circuit connected to a second pixel unit is disposed in a peripheral region that are corresponding to a first edge and a second edge. The first pixel unit is a pixel unit from which a distance to the third edge in a column direction is less than or equal to a first threshold value, and the second pixel unit is a pixel unit from which a distance to the third edge in the column direction is less than or equal to the first threshold value.

For example, in a display panel in FIG. 6, the first threshold value is a distance from the pixel units in the sixth row to the upper border frame region. GOA circuits corresponding to pixel units in the sixth row to the tenth row are disposed in the upper border frame region, and GOA circuits corresponding to remaining pixel units are disposed in the left border frame region and the right border frame region. It may be understood that a value of the first threshold value is related to a specific dimension of the display panel. This is not limited herein.

Figure 7:
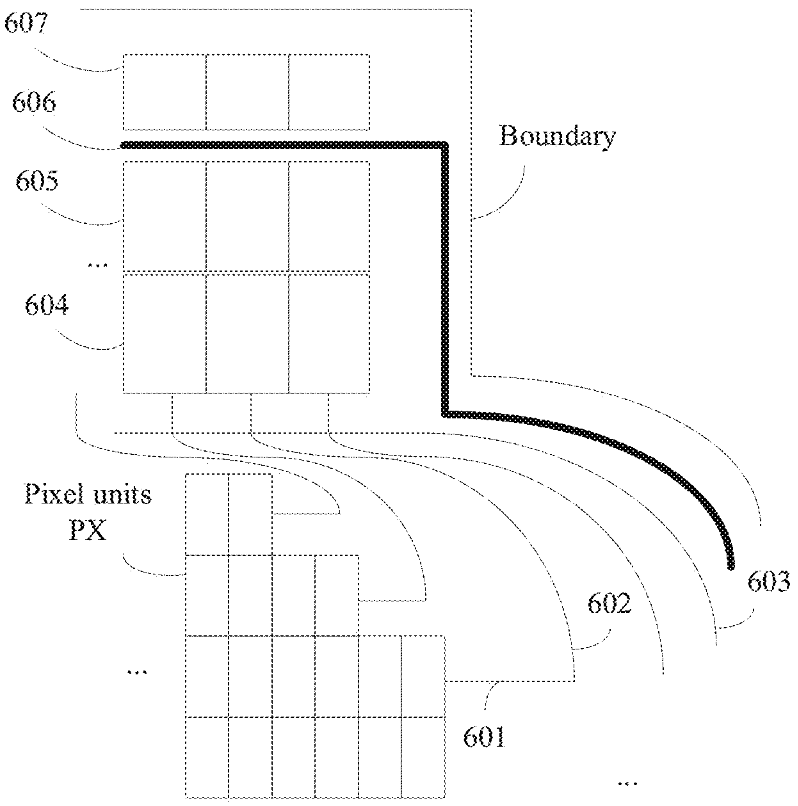
FIG. 7 is a schematic diagram of a structure of an R corner of a display device according to a possible implementation.

FIG. 7 is a schematic diagram of a part of the display panel in FIG. 6. As shown in FIG. 7, the R corner region 1 includes: pixel units PX, GOA output lines 601, GOA signal lines 602, signal lines 603 required for working of a pixel unit, GOA circuits 604, a VSS signal providing region 605, a protection and detection region 606, and a Dam region 607. The GOA circuit 604 is disposed in a right border frame region and does not occupy space in the R corner region. The pixel unit PX corresponding to the R corner region and a corresponding GOA circuit 604 are connected through the GOA signal line 602 and the GOA output line 601. The GOA signal line 602 extends to a right border frame region along the corner, to be connected to the GOA circuit 602.

In a possible implementation, the GOA circuits are arranged in the left border frame region and the right border frame region, and a longitudinal dimension of the GOA circuits is smaller than a longitudinal dimension of pixel units PX corresponding to the GOA circuits, to enable the left border frame region and the right border frame region to include all GOA circuits.

In the display panel, a signal line of a GOA circuit corresponding to the R corner region occupies space in the R corner region. As a result, the border frame in the R corner region is large and cannot be narrowed.

In view of this, in embodiments of this application, because the bottom drive circuit in the pixel unit is smaller than the light-emitting device in the pixel unit, space for the GOA signal line is reserved, to lead out the GOA signal line from the middle of the pixel unit PX without passing through the R corner. This enables the GOA signal line not to occupy space in the R corner and the lower border frame, and then narrows the lower border frame.

The following describes a display circuit in embodiments of this application with reference to the accompanying drawings.

Figure 8:
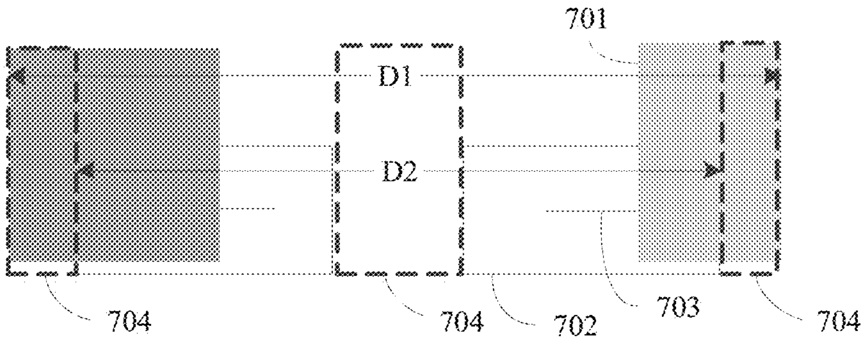
FIG. 8 is a schematic diagram of a structure of a pixel unit according to an embodiment of this application.

FIG. 8 is a schematic diagram of a structure of a pixel unit according to an embodiment of this application. As shown in FIG. 8, the pixel unit includes light-emitting devices 701, bottom drive circuits 702, and anode leads 703.

The light-emitting device 701 is connected to the bottom drive circuit 702 by using the anode lead 703.

The light-emitting device 701 is configured to emit light. The light-emitting device 701 may emit one or more of red light, green light, and blue light. This is not limited in this embodiment of this application. For example, each light-emitting device 701 may alternatively emit light of other colors such as cyan, magenta, and yellow. Light emitted by a plurality of light-emitting devices 701 constitutes a display image. The light-emitting device 701 may be an organic light-emitting diode. Dimensions and shapes of the light-emitting devices 701 may be the same, or may be different. This is not limited in this embodiment of this application.

The bottom drive circuit 702 is configured to drive the light-emitting device 701. The bottom drive circuit 702 may include a plurality of transistors, capacitors, and the like.

For example, the bottom drive circuit 702 may include a first transistor T1, a second transistor T2, and a capacitor Cst. The first transistor T1 and the second transistor T2 may be thin film transistors.

The second transistor T2 is a switching transistor, and may be connected to a scanning line and a data line. The second transistor T2 is configured to transmit, to the first transistor T1 based on a switching voltage input to the scanning line, a data signal input from the data line.

The capacitor Cst may be connected to the second transistor T2 and a supply voltage line. The capacitor Cst is configured to store a voltage corresponding to a difference between a voltage corresponding to the data signal received from the second transistor T2 and a first supply voltage ELVDD supplied to the supply voltage line. The supply voltage line may be spaced parallel to the scanning line or the data line.

The first transistor T1 is a drive transistor, and may be connected to the supply voltage line and the capacitor Cst. The first transistor T1 is configured to control, in response to a voltage value stored in the capacitor Cst, a drive current Ioled flowing through the light-emitting device 701, to control light-emitting intensity of the light-emitting device 701, and the like. The bottom drive circuit 702 may alternatively be a 7T1C circuit or the like. A quantity of transistors and a quantity of capacitors may be variable based on a design of the bottom drive circuit. This is not limited in this embodiment of this application.

In this embodiment of this application, a dimension of a region enclosed by the bottom drive circuits is smaller than a dimension of a region enclosed by the pixel units. This enables a gap to exist between the bottom drive circuits, and helps a GOA signal line pass through the gap subsequently. For example, a dimension of the light-emitting device in a row direction is larger than a dimension of the bottom drive circuit corresponding to the adjacent light-emitting devices in the row direction.

In FIG. 8, a dimension D2 of a region enclosed by the bottom drive circuits in the row direction is smaller than a dimension D1 of a region enclosed by the pixel units in the row direction. This enables a gap 704 to exist between the bottom drive circuits.

When D1 is larger than D2, it may be understood that a width of the bottom drive circuit 702 is smaller than a width of the light-emitting device 701 controlled by the bottom drive circuit. Alternatively, it may be understood that occupation space of the bottom drive circuit 702 of the pixel unit is smaller than occupation space of a GOA signal line of the light-emitting device 701 controlled by the bottom drive circuit, or the plurality of light-emitting devices 701 are divergent relative to corresponding bottom drive circuits 702. In this way, a gap 704 exists between adjacent bottom drive circuits 702. This may improve transmittance of a backplane. Alternatively, the gap 704 is used to arrange the GOA signal line, to reduce a quantity of GOA signal lines in a border frame at an R corner.

Figure 9:
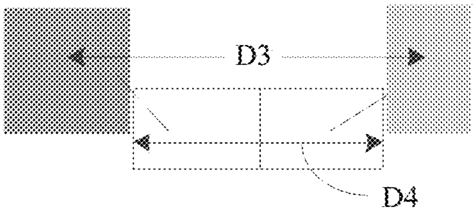
FIG. 9 is a schematic diagram of a structure of a pixel unit according to an embodiment of this application.

In a possible implementation, to increase a width of the gap, and facilitate arrangement of a data connection line, an interval between geometric centers of adjacent light-emitting devices in the row direction is larger than a dimension between corresponding bottom drive circuits in the row direction. As shown in FIG. 9, D3 is a dimension between geometric centers of adjacent light-emitting devices in the row direction, and D4 is a dimension between the adjacent bottom drive circuits in the row direction. D3 is larger than D4. In a possible implementation, one pixel unit includes a plurality of light-emitting devices. Bottom drive circuits of the plurality of light-emitting devices may be arranged or integrated together, to enable a ratio of an area of the plurality of bottom drive circuits to an area of the plurality of light-emitting devices in the pixel unit to be less than 1.

Figure 10:
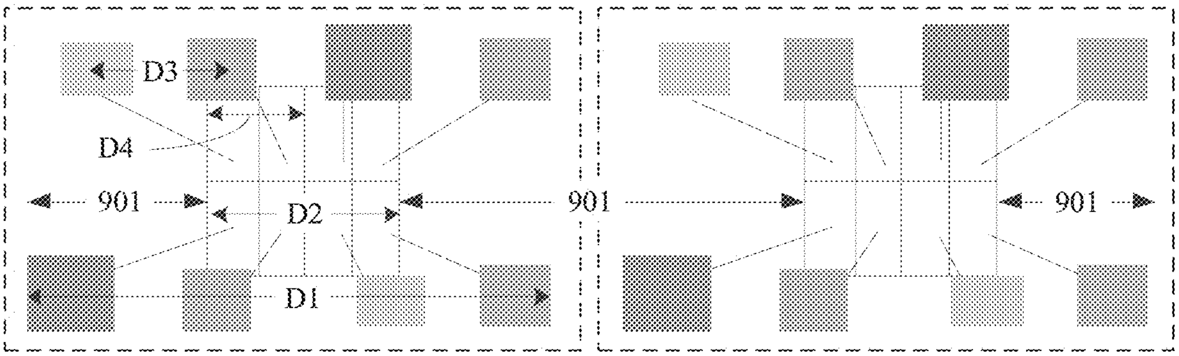
FIG. 10 is a schematic diagram of a structure of a pixel unit according to an embodiment of this application.

For example, the light-emitting devices in the display circuit are periodically arranged in a matrix shape. As shown in FIG. 10, one pixel unit may include two rows*four columns of light-emitting devices. Light-emitting devices in a first row respectively emit red light, green light, blue light, and green light, and light-emitting devices in a second row respectively emit blue light, green light, red light, and green light. A color of light emitted by the light-emitting devices in the pixel unit and an arrangement sequence of the light are not limited in this embodiment of this application.

In FIG. 10, a dimension D2 of a region enclosed by bottom drive circuits is smaller than a dimension D1 of a region enclosed by pixel units, and the bottom drive circuits of eight light-emitting devices in the pixel unit are arranged together. In this case, a ratio of an area of the bottom drive circuits to the light-emitting devices in the pixel unit is less than 1. An occupancy area of the bottom drive circuits of the plurality of light-emitting devices is reduced, and gaps 901 between the bottom drive circuits of the adjacent pixel units are increased. This facilitates arrangement of GOA signal lines or further improves the transmittance of the backplane.

In FIG. 10, a dimension D3 between geometric centers of adjacent light-emitting devices in the row direction is larger than a dimension D4 between adjacent bottom drive circuits in the row direction. This is not limited in this embodiment of this application.

It may be understood that one pixel unit may alternatively include another quantity of light-emitting devices. A quantity of the light-emitting device and arrangement of the bottom drive circuit in the pixel unit are not limited in this embodiment of this application. A pixel unit may be square or rectangular. This is not limited herein.

In a possible implementation, the light-emitting device may have various shapes, and the same row of the light-emitting devices may not be located on a same straight line. A shape of the light-emitting device and arrangement of the light-emitting device are not limited in this embodiment of this application.

Figure 11:
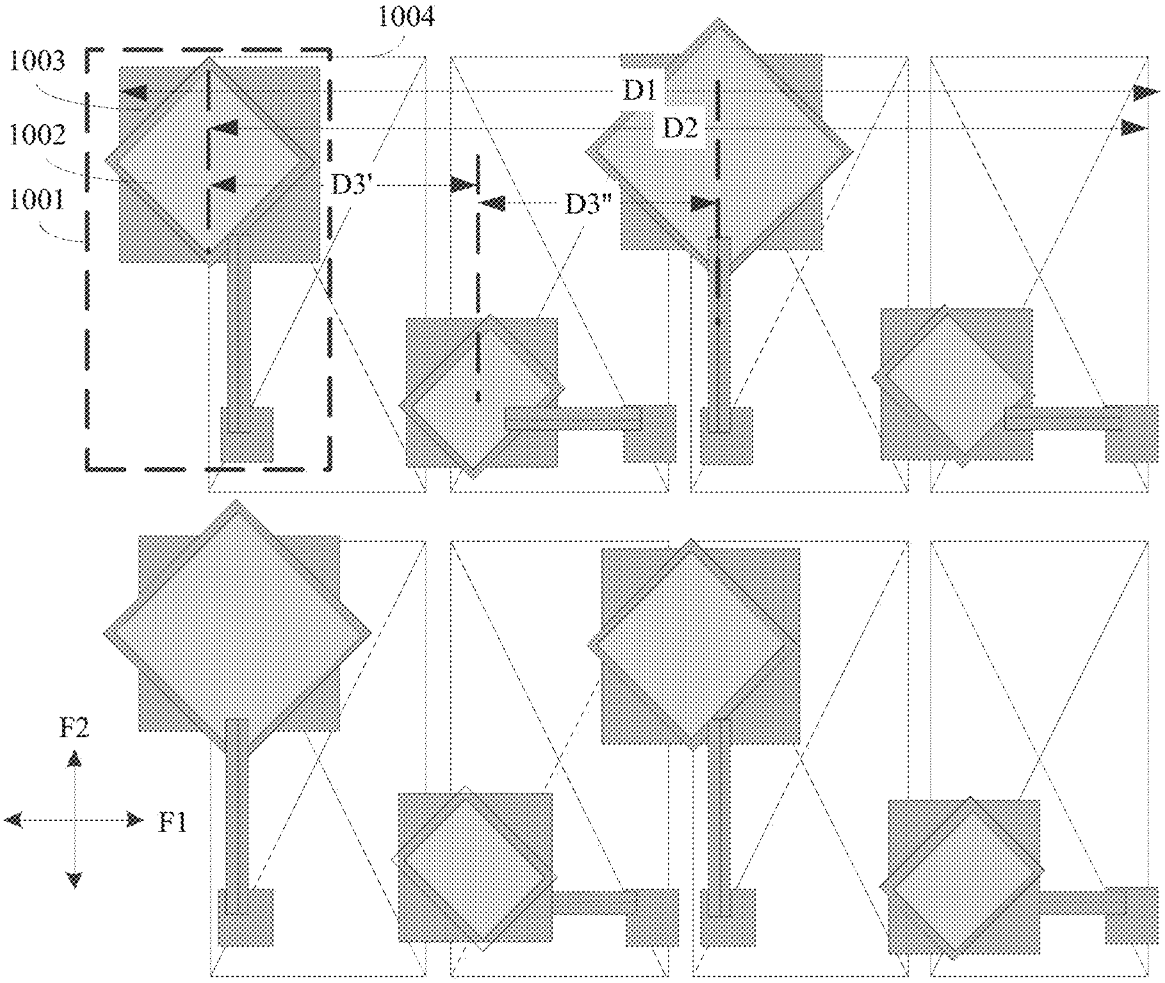
FIG. 11 is a schematic diagram of a structure of a pixel unit according to an embodiment of this application.

For example, as shown in FIG. 11, a pixel unit includes a plurality of light-emitting devices 1001 and a plurality of bottom drive circuits 1004. The light-emitting device 1001 includes a light-emitting region 1002 and a process redundancy region 1003. The light-emitting region 1002 is diamond-shaped.

In FIG. 11, a dimension D2 of a region enclosed by the bottom drive circuits in the row direction is smaller than a dimension D1 of a region enclosed by the pixel unit in the row direction, to enable a gap to exist between the bottom drive circuits. When D1 is larger than D2, a gap exists between bottom drive circuits 1002 corresponding to light-emitting devices 1001 in a first column and light-emitting devices 1001 in a second column in the pixel unit. This improves transmittance of a backplane, or the gap is used to arrange the GOA signal line, to reduce a quantity of GOA signal lines in the border frame at the R corner.

In a possible implementation, intervals D3 between adjacent light-emitting devices in the pixel unit may be equal or may not be equal. For example, in FIG. 11, an interval D3' between a geometric center of the first light-emitting region 1002 and a geometric center of the second light-emitting region 1002 in the first direction F1 is not equal to an interval D3" between the geometric center of the second light-emitting region 1002 and a geometric center of the third light-emitting region 1002 in the first direction F1.

Arrangement of the light-emitting devices in the pixel unit shown in FIG. 10 and FIG. 11 is one of RGB (for example, SPR-RGB) including an algorithm. Alternatively, an arrangement manner of the light-emitting devices includes a real-RGB (real-RGB) manner. The arrangement manner of the light-emitting devices is not limited in this embodiment of this application.

Figure 12:
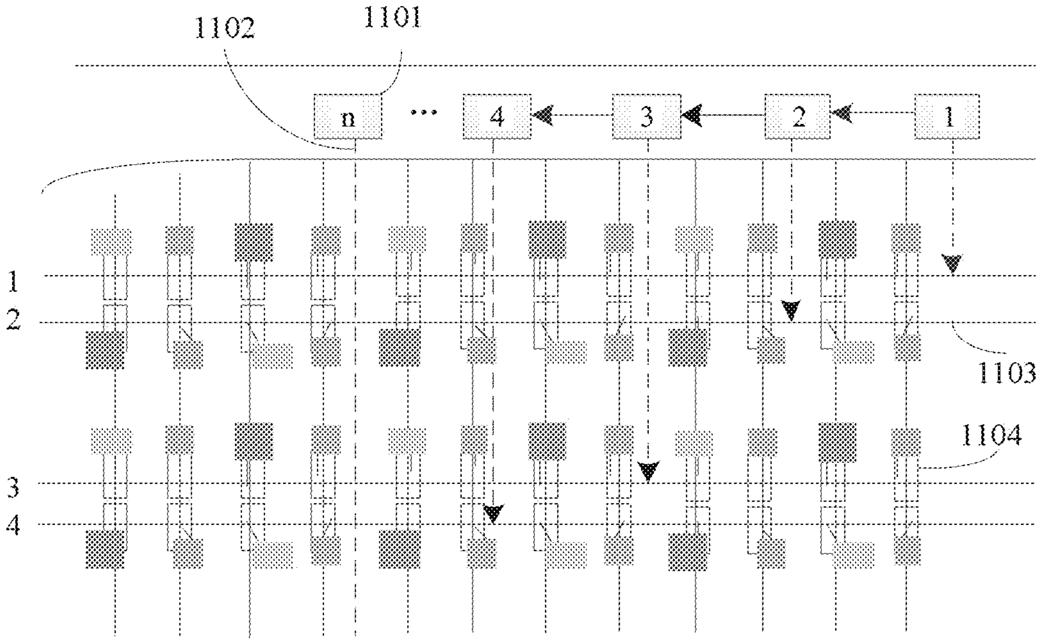
FIG. 12 is a schematic diagram of a structure of a specific display circuit according to an embodiment of this application.

FIG. 12 is a schematic diagram of a structure of a specific display circuit according to an embodiment of this application. As shown in FIG. 12, the display circuit includes GOA circuits 1101. GOA signal lines 1102. GOA output lines 1103, and pixel units 1104. FIG. 12 shows an example of two rows*12 columns of pixel units 1104 and a plurality of GOA circuits 1101. The GOA signal line 1102 is connected to the GOA circuit 1101 and the GOA output line 1103.

The GOA circuit 1101 is located in an upper border frame region. The GOA signal line 1102 extends in a column direction and passes through a gap between the pixel units 1104, to connect to a corresponding GOA output line 1103. The GOA output line 1103 is used to connect bottom drive circuits corresponding to a row of light-emitting devices. For example, the first GOA circuit 1101 is connected to a GOA output line 1103 corresponding to light-emitting devices in the first row through the GOA signal line 1102 and the GOA output line 1103.

In this embodiment of this application, a GOA signal line corresponding to an upper border frame passes through the pixel unit, and does not occupy space in an R corner region. This narrows a border frame at the R corner, beautifies visual effect, and avoids wrinkles. In addition, no new film layer is added due to the manner that GOA signal line passes through the pixel unit, so that a process is simple.

Based on the foregoing embodiments, the bottom drive circuits corresponding to the light-emitting devices in the pixel units may be arranged together, so that occupation space is further reduced. A space distance between adjacent pixel units is large, to accommodate arrangement of more data lines.

Figure 13:
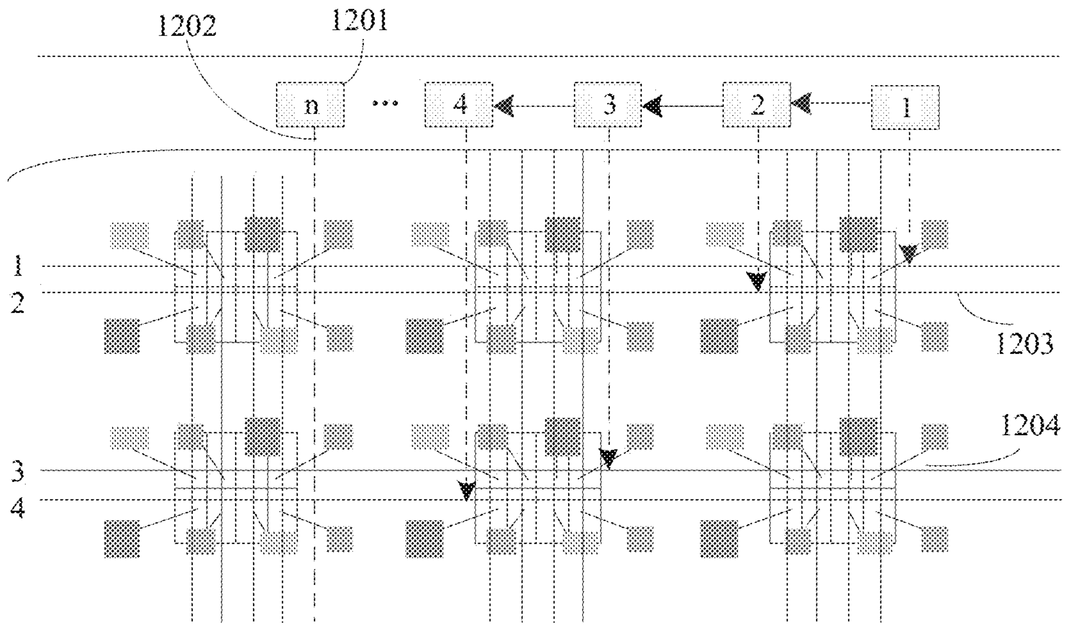
FIG. 13 is a schematic diagram of a structure of a specific display circuit according to an embodiment of this application.

For example, the pixel unit includes two rows*four columns of light-emitting devices. As shown in FIG. 13, the display circuit includes GOA circuits 1201. GOA signal lines 1202, GOA output lines 1203, and pixel units 1204. FIG. 13 shows an example of two rows*three columns of pixel units 1204 and a plurality of GOA circuits 1201. The GOA signal line 1202 is connected to the GOA circuit 1201 and the GOA output line 1203.

The GOA circuit 1201 is located in an upper border frame region. The GOA signal line 1202 extends in a column direction and passes through a gap between the pixel units 1204, to connect to a corresponding GOA output line 1203. The GOA output line 1203 is used to connect bottom drive circuits corresponding to a row of light-emitting devices. For example, the first GOA circuit 1201 is connected to a GOA output line 1203 corresponding to light-emitting devices in the first row through the GOA signal line 1202.

Compared with FIG. 12, in this embodiment of this application, one pixel unit includes two rows*four columns of light-emitting devices, and bottom drive circuits corresponding to the light-emitting devices in the one pixel unit are arranged together. This further reduces occupation, and facilitate arrangement of the GOA signal lines.

Figure 14:
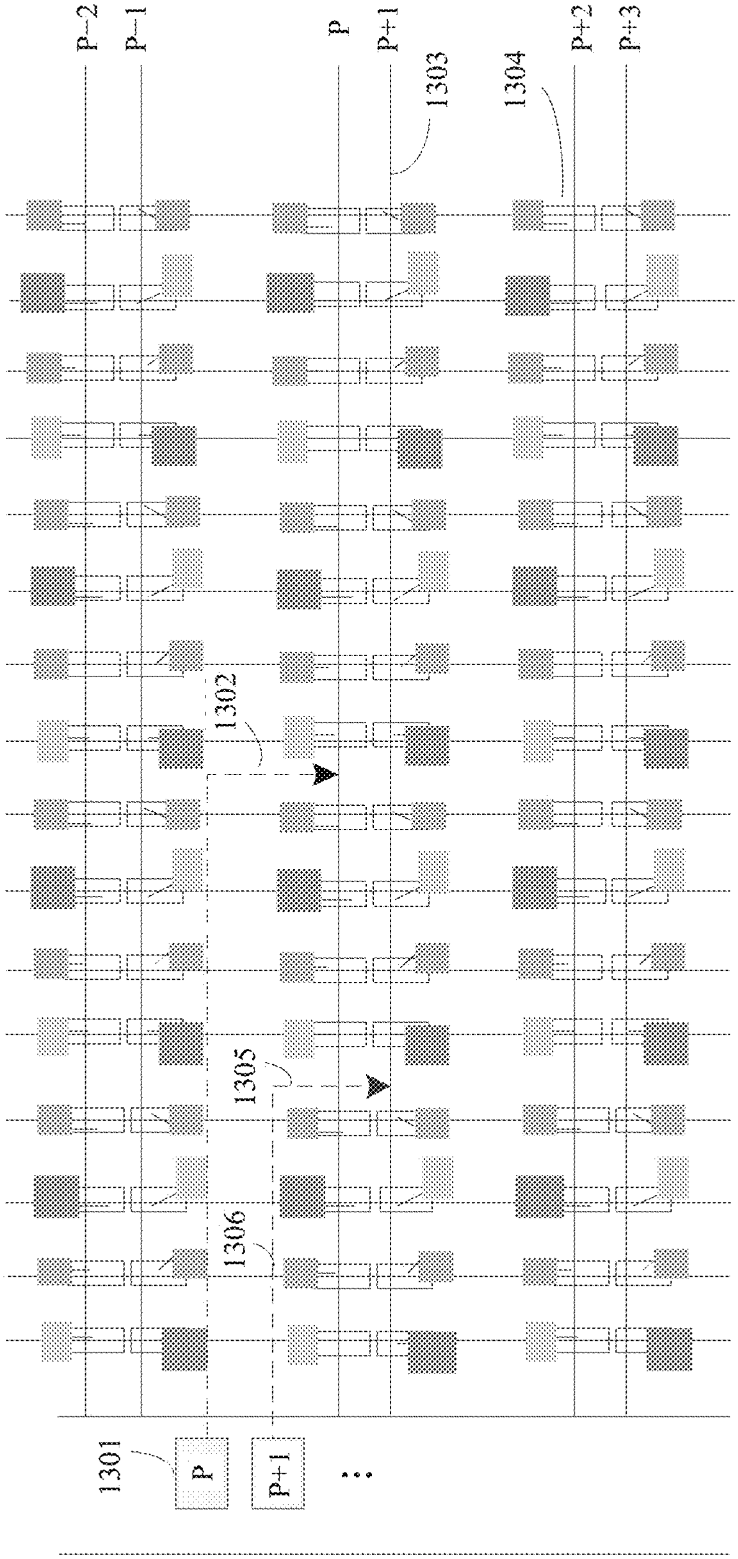
FIG. 14 is a schematic diagram of a structure of a specific display circuit according to an embodiment of this application.

FIG. 14 is a schematic diagram of a structure of a specific display circuit according to an embodiment of this application. As shown in FIG. 14, the display circuit includes GOA circuits 1301, GOA signal lines 1302, GOA output lines 1303, and pixel units 1304. FIG. 14 shows an example of three rows*16 columns of pixel units 1304 and a plurality of GOA circuits 1301. The GOA signal line 1302 is connected to the GOA circuit 1301 and the GOA output line 1303.

The GOA circuit 1201 is located in an upper border frame region. The GOA signal line 1302 extends and passes through a gap between the pixel units 1304, to connect to a corresponding GOA output line 1303. The GOA signal line 1302 includes a first part connection line 1305 that extends in a column direction, a second part connection line 1306 that extends in a row direction. The first part connection line 1305 is connected to the second part connection line 1306 at a right angle.

The GOA output line 1303 is used to connect bottom drive circuits corresponding to a row of light-emitting devices. For example, a $p^{th}$ GOA circuit 1301 is connected to a GOA output line 1303 corresponding to light-emitting devices in a $p^{th}$ row through the GOA signal line 1302.

In this embodiment of this application. GOA signal lines corresponding to a left border frame and a right border frame pass through the pixel unit, and do not occupy space in an R corner region. This narrows a border frame at the R corner, beautifies visual effect, and avoids wrinkles. In addition, no new film layer is added due to the manner that GOA signal line passes through the pixel unit, so that a process is simple.

Based on the foregoing embodiments, the bottom drive circuits corresponding to the light-emitting devices in the pixel units may be arranged together, so that occupation space is further reduced. A space distance between adjacent pixel units is large, to accommodate arrangement of more data lines.

Figure 15:
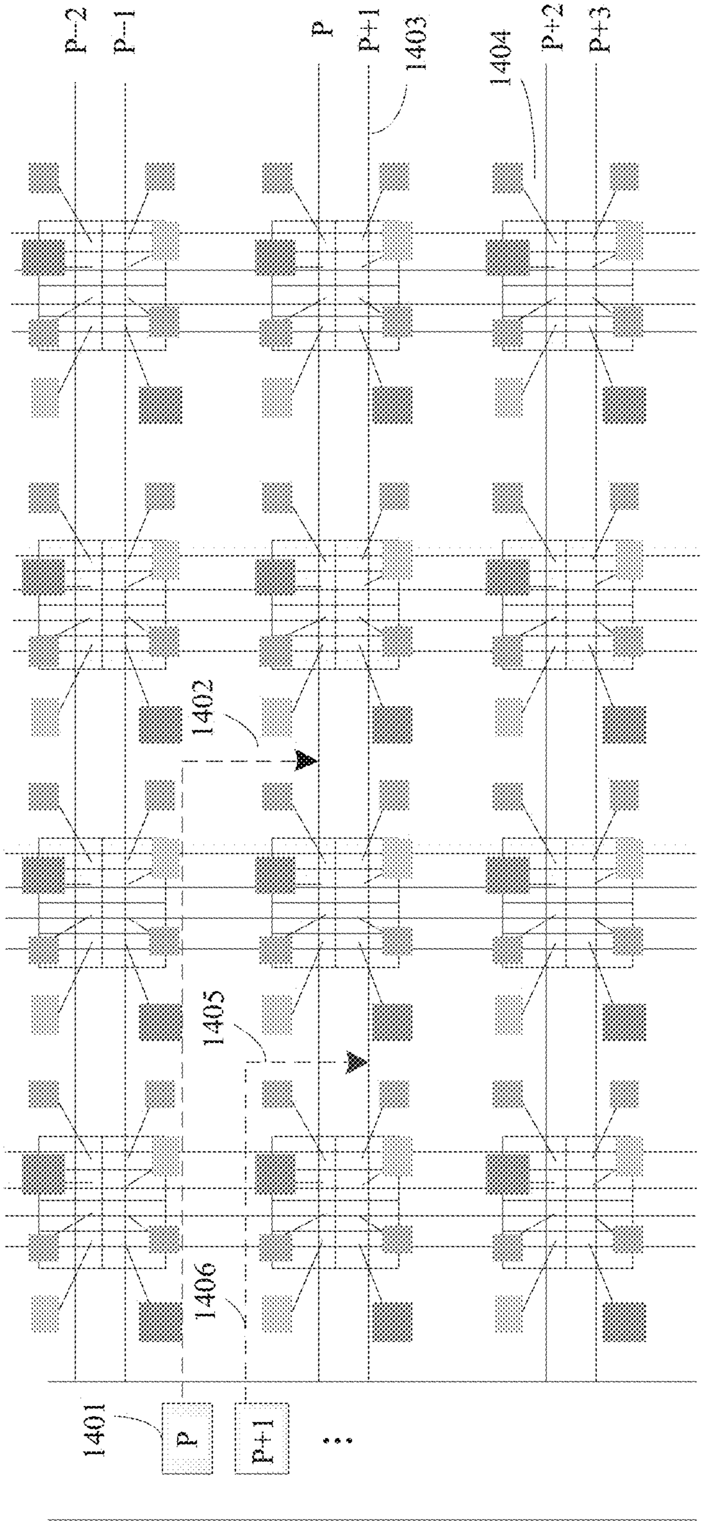
FIG. 15 is a schematic diagram of a structure of a specific display circuit according to an embodiment of this application.

For example, the pixel unit includes two rows*four columns of light-emitting devices. As shown in FIG. 15, the display circuit includes GOA circuits 1401, GOA signal lines 1402, GOA output lines 1403, and pixel units 1404. FIG. 15 shows an example of three rows*three columns of pixel units 1404 and a plurality of GOA circuits 1401. The GOA signal line 1402 is connected to the GOA circuit 1401 and the GOA output line 1403.

The GOA circuit 1401 is located in an upper border frame region. The GOA signal line 1402 extends and passes through a gap between the pixel units 1404, to connect to a corresponding GOA output line 1403. The GOA lead 1403 is used to connect bottom drive circuits corresponding to a row of light-emitting devices. For example, a $p^{th}$ GOA circuit 1401 is connected to a GOA output line 1403 corresponding to light-emitting devices in a $p^{th}$ row through the GOA signal line 1402.

Compared with FIG. 14, in this embodiment of this application, one pixel unit includes two rows*four columns of light-emitting devices, and bottom drive circuits corresponding to the light-emitting devices in the one pixel unit are arranged together. This further reduces occupation, and facilitate arrangement of the GOA signal lines.

Figure 16:
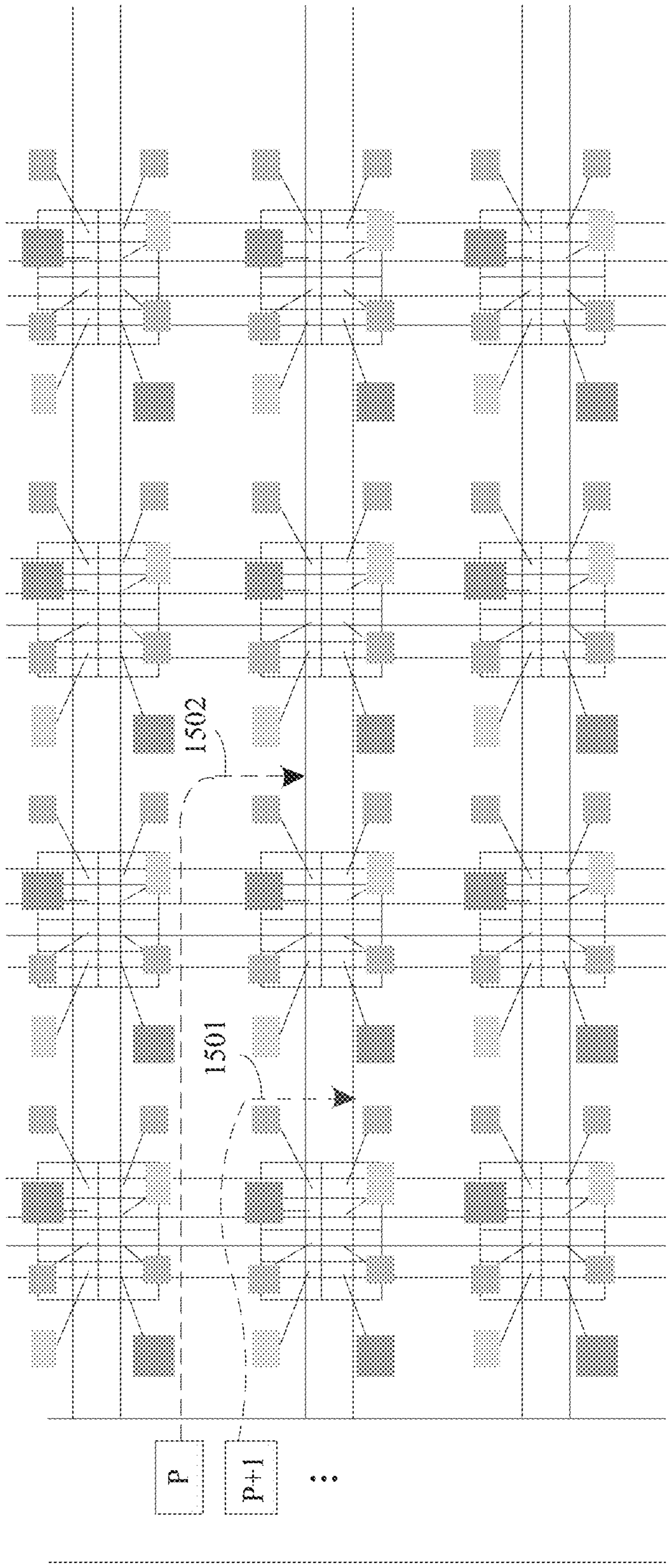
FIG. 16 is a schematic diagram of a structure of a specific display circuit according to an embodiment of this application.

The GOA signal line in the foregoing embodiments linearly extends and connected at a right corner, and the GOA signal line may alternatively extend in a curved shape and/or is connected at a rounded angle. The GOA signal line may be arranged between pixel units in a Z shapes, a Ω shape, or a zigzag shape. A specific arrangement shape of the GOA signal line is not limited in this embodiment of this application. For example, as shown in FIG. 16, the GOA signal line may be wired in manners of extending in a curved shape 1501 and a rounded angle connection 1502.

Based on the foregoing embodiments, to narrow a border frame at an R corner, the data connection lines in the display panel may pass through a gap between pixel units.

Figure 17:
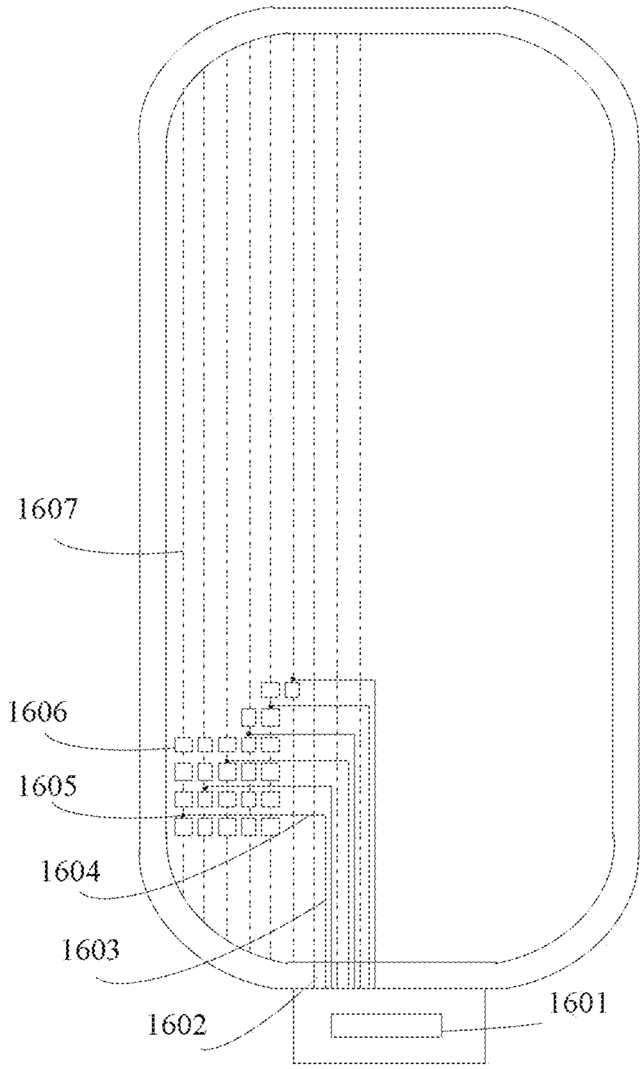
FIG. 17 is a schematic diagram of a structure of a display circuit according to an embodiment of this application.

The following describes an arrangement of the data connection lines with reference to FIG. 17. FIG. 17 is a schematic diagram of a structure of a display panel according to an embodiment of this application. A display circuit includes: a signal providing region 1601, a signal lead region 1602, a data lead I 1603, a data lead II 1604, a signal line adapter 1605, a pixel unit 1606, and a data line 1607.

The signal providing region 1601 is used to output a data signal. The signal providing region 1601 is connected to a data driver, to output the data signal.

The signal lead region 1602 includes a plurality of signal leads. Two ends of each signal lead respectively are connected to the signal providing region 1601 and the data line 1607, or respectively connected to the signal providing region 1601 and the data lead I 1603. The signal lead region 1602 is used to transmit the data signal to the data line 1607 or the data lead I 1603. It should be noted that the signal lead may also be referred to as a signal line.

The data lead I 1603 and the data lead II 1604 are respectively data leads arranged in two directions, and are used to connect the signal providing region 1601 and the data line 1607. The data lead I 1603 are arranged in a column direction of the pixel unit 1606. The data lead II 1604 are arranged in a row direction of the pixel unit 1606. The data lead I 1603 may also be referred to as a second part connection line, and the data lead II 1604 may also be referred to as a first part connection line. The data lead I 1603 and the data lead I 1604 may be collectively referred to as a data connection line.

The data lead I 1603 and the data lead II 1604 may be located in film layer that can conduct electricity, for example, a Gate1 film layer (metal layer, such as molybdenum (Mo) metal or the like), a Gate2 film layer (metal layer, such as molybdenum (Mo) metal or the like), a Gate3 film layer (metal layer, such as molybdenum (Mo) metal or the like), an ITO film layer, or an SD film layer (metal layer, Metal layer, Ti/Al/Ti titanium/aluminum/titanium), or the like. This is not limited herein.

The signal adapter 1605 is configured to connect the data lead II 1604 and the data line 1607.

The pixel unit 1606 is used to emit light based on a data signal transmitted by the data line 1607.

The data line 1607 is used to transmit the data signal, and the data signal transmitted by the data line 1607 can control the pixel unit 1606 to emit light or not to emit light, control intensity of an emitted light, and the like.

It may be understood that a data signal outputted by the signal providing region 1601 is transmitted to the data line 1607 through the signal lead region 1602, to control display of a column of pixel units 1606 corresponding to the data line 1607. The data signal output from the signal providing region 1601 is transmitted to the data line 1607 through the signal lead region 1602, the data lead I 1603, the data lead II 1604, and the signal line adapter 1605, to control display of the column of pixel units 1606 corresponding to the data line 1607.

In the display circuit shown in FIG. 17, the data lead passes between the pixel units, so as not to extend from the R corner. This saves space at the R corner and a lower border frame. In the display circuit shown in FIG. 17, the lower border frame of the display panel is narrowed, so that the display is more beautiful.

In a possible implementation, the bottom drive circuits corresponding to the light-emitting devices in the pixel units may be arranged together, so that occupation space is further reduced. A space distance between adjacent pixel units is large, to accommodate arrangement of more data connection lines.

It may be understood that the data connection line in FIG. 17 linearly extends and is connected at a right angle, and the data connection line may alternatively extend in a curved shape and/or is connected at a rounded angle. The data connection line may be arranged between pixel units in a Z shape, a Ω shape, or a zigzag shape. A specific arrangement shape of the data connection line is not limited in this embodiment of this application.

Based on the foregoing embodiments, the display region further includes an under display camera (under display camera. UDC) region that is disposed around a hole. The UDC region needs to have specific transmittance, to ensure display effect.

Figure 18:
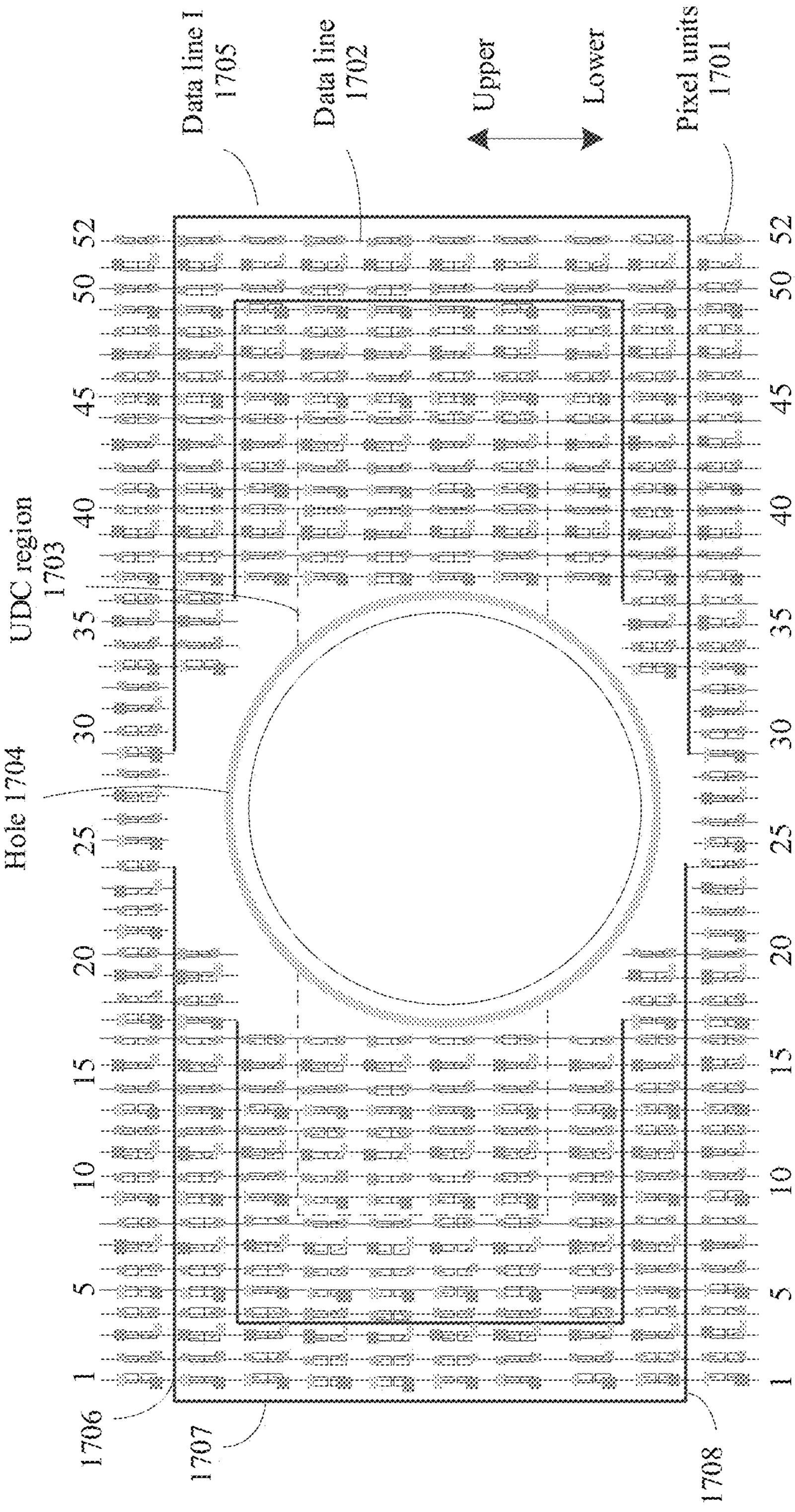
FIG. 18 is a schematic diagram of a structure of a specific display circuit according to an embodiment of this application.

The following describes arrangement of data lines near the UDC region. FIG. 18 is a schematic diagram of a structure of a specific display circuit according to an embodiment of this application. As shown in FIG. 18, the display circuit includes pixel units 1701, data lines 1702, a UDC region 1703, a hole 1704, and a data line I 1705.

For functions and structures of the pixel units 1701 and the data lines 1702, refer to the descriptions of the foregoing related structures. Details are not described herein. The UDC region 1703 is configured to dispose a sensor, and the hole 1704 is used to dispose a lens of a camera.

The data line I 1705 includes a third part connection line 1706, a fourth part connection line 1707, and a fifth part connection line 1708. The third part connection line 1706, the fourth part connection line 1707, and the fifth part connection line 1708 are connected to each other. The third part connection line 1706 is located on an upper side of the center of the hole 1704, and the fifth part connection line 1708 is located on a lower side of the center of the hole 1704.

The third part connection line 1706 extends in a row direction and passes through gaps between the pixel units 1701 to connect the fourth part connection line 1707: the fourth part connection line 1707 extends in a column direction and passes through gaps between the pixel units 1701 to connect the fifth part connection line 1708; and the fifth part connection line 1708 extends in the row direction and passes through gaps between the pixel units 1701.

The third part connection line 1706, the fourth part connection line 1707 and the fifth part connection line 1708 are connected at right angles.

FIG. 18 shows an example of 20 rows*52 columns of pixel units 1701 and a plurality of data lines 1702. Some of the pixel units in the $9^{th}$ column to the $16^{th}$ column and some of the pixel units in a $37^{th}$ column to a $44^{th}$ column are located in a UDC region 1703. Some of the pixel units 1701 in the hole 1704 and a surrounding region of the hole 1704 are missing, and therefore a quantity of pixel units in the $17^{th}$ column to the $36^{th}$ column is small.

As shown in FIG. 18, pixel units in the first column to the $16^{th}$ column and pixel units in the $37^{th}$ column to the $52^{nd}$ column are connected by using the data lines 1702. The pixel units in the $17^{th}$ column to the $36^{th}$ column are connected by using the data lines 1702 and a data line I 1705.

In this way, when the pixel units in the $17^{th}$ column to the $36^{th}$ column corresponding to the hole 1704 are connected, the data lines 1702 do not pass through the UDC region 1703 and do not occupy space in the UDC region 1703. This improves transmittance of the UDC region 1703, and improves shooting effect of the camera.

In this embodiment of this application, all the third part connection line, the fourth part connection line, and the fifth part connection line are parts of the data lines and pass through gaps between pixel units. In this way, when the pixel units corresponding to the hole are connected, the data lines do not pass through the UDC region and do not occupy space in the UDC region. This improves transmittance of the UDC region, and improves shooting effect of the camera.

In a possible implementation, the bottom drive circuits corresponding to the UDC region may move in the column direction even in the row direction. The bottom drive circuits corresponding to the UDC region may not be in the display region and may move to the peripheral region (for example, a border frame region). Positions of the bottom drive circuits corresponding to the UDC region are not limited in this embodiment of this application. In this way, transmittance of the UDC region may be further improved, and shooting effect of the camera is improved.

In a possible implementation, the bottom drive circuits in the pixel units corresponding to the UDC region move to another position, and the anode leads are made of a transparent material. In this way, transmittance of the UDC region is further improved, and shooting effect of the camera is improved.

Figure 19:
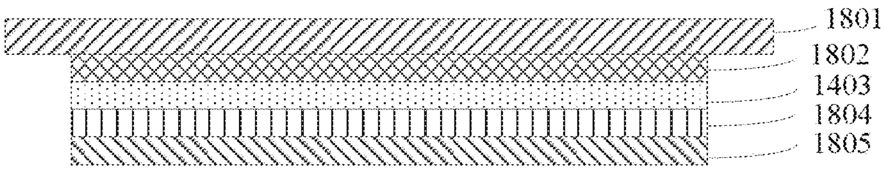
FIG. 19 is a schematic diagram of a structure of a display according to an embodiment of this application.

An embodiment of this application further provides a display. The display includes the foregoing display panel, and the display panel is configured to display an image. For example, FIG. 19 is a schematic diagram of a structure of a display according to an embodiment of this application. As shown in FIG. 19, the display includes, but is not limited to, a protection cover plate 1801, a polarizer 1802, a display panel 1803, a heat dissipation layer 1804, and a protection layer 1805.

The polarizer 1802 is fixed to the protection cover plate 1801. The protection cover plate 1801 may be a transparent glass cover plate or an organic material cover plate such as polyimide, to reduce impact on a display effect of the display while providing protection. The polarizer 1802 may be a circular polarizer, and is configured to avoid anode reflection of light. The heat dissipation layer 1804 may be a heat dissipation copper foil, and the protection layer 1805 may be a protection foam. The layer structures of the display may be bonded by using an optical transparent adhesive or a non-transparent pressure sensitive adhesive. In addition, because ingredients such as water vapor and oxygen in the air have great impact on service life of a light-emitting device of the display panel 1803, water-and-oxygen encapsulation needs to be strictly performed on the light-emitting device of the display panel, to sufficiently separate functional layers of the light-emitting device from the ingredients such as water vapor and oxygen in the air.

In this embodiment of this application, the display may be a flexible display or a rigid display. For example, the display may be an OLED display, a QLED flexible display, a curled screen, a foldable screen, or the like.

Figure 20:
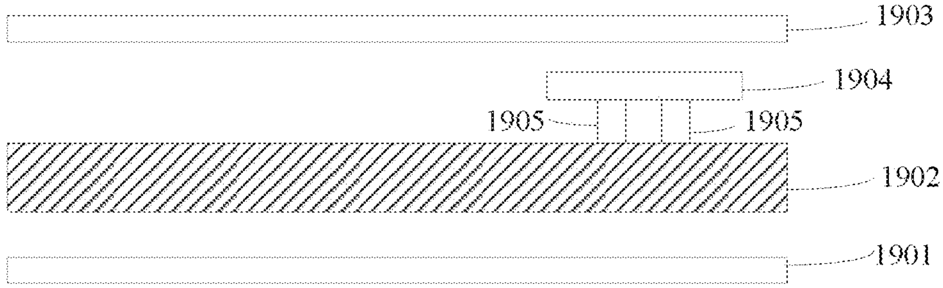
FIG. 20 is a schematic diagram of a structure of a display device according to an embodiment of this application.

An embodiment of this application further provides a display device. The display device includes the foregoing display, and the display is configured to display an image. For example, as shown in FIG. 20, the display device includes, but is not limited to, a display 1901, a middle frame 1902, a rear housing 1903, and a printed circuit board (printed circuit board, PCB) 1904. The middle frame 1902 may be configured to bear the printed circuit board and the display 1901. The display 1901 and the printed circuit board are located on two sides of the middle frame 1902, and the rear housing 1903 is located on one side of the printed circuit board away from the middle frame 1902. In addition, the display device may further include a component 1905 disposed on the PCB 1904, where the component 1905 may be, but is not limited to be, disposed on one side of the PCB 1904 toward the middle frame 1902.

In this embodiment of this application, the display device may be a terminal device having a display: For example, the terminal device includes: a mobile phone (mobile phone), a tablet computer, a notebook computer, a palmtop computer, a mobile internet device (mobile internet device, MID), a wearable device, a virtual reality (virtual reality, VR) device, an augmented reality (augmented reality, AR) device, a wireless terminal in industrial control (industrial control), a wireless terminal in self driving (self driving), a wireless terminal in remote medical surgery (remote medical surgery), a wireless terminal in smart grid (smart grid), a wireless terminal in transportation safety (transportation safety), a wireless terminal in smart city (smart city), a wireless terminal in smart home (smart home), a cellular phone, a cordless phone, a session initiation protocol (session initiation protocol. SIP) phone, a wireless local loop (wireless local loop, WLL) station, a personal digital assistant (personal digital assistant, PDA), a handheld device having a wireless communication function, a computing device or another processing device connected to a wireless modem, a vehicle-mounted device, a wearable device, a terminal device in a 5G network, a terminal device in a future evolved public land mobile network (public land mobile network, PLMN), or the like. This is not limited in this embodiment of this application.

In addition, in this embodiment of this application, the terminal device may also be a terminal device in an Internet of Things (Internet of Things, IoT) system. IoT is an important part in future development of information technologies, and is mainly technically characterized in that things are connected to networks through communication technologies, to achieve intelligent networks of human-machine interconnection and interconnection between things.

The terminal device in this embodiment of this application may alternatively be referred to as user equipment (user equipment, UE), a mobile station (mobile station, MS), a mobile terminal (mobile terminal, MT), an access terminal, a user unit, a user station, a mobile site, a mobile station, a remote station, a remote terminal, a mobile device, a user terminal, a terminal, a wireless communication device, a user agent, or a user apparatus.

In embodiments of this application, the terminal device or each network device includes a hardware layer, an operating system layer that runs at the hardware layer, and an application layer that runs at the operating system layer. The hardware layer includes hardware such as a central processing unit (central processing unit. CPU), a memory management unit (memory management unit, MMU), and an internal memory (also referred to as a main memory). The operating system may be any one or more computer operating systems for implementing service processing through a process (process), for example, a Linux operating system, a Unix operating system, an Android operating system, an iOS operating system, or a Windows operating system. The application layer includes applications such as a browser, an address book, word processing software, and instant messaging software.

The foregoing descriptions are merely specific implementations of this application, but the protection scope of embodiments of this application is not limited thereto. Any variation or replacement within the technical scope disclosed in embodiments of this application shall fall within the protection scope of embodiments of this application. Therefore, the protection scope of embodiments of this application shall be subject to the protection scope of the claims.

What is claimed is:

1. A display panel, comprising:

a display region comprising a first edge, a second edge, a third edge, and a fourth edge, wherein the first edge is disposed opposite to the second edge, the third edge is disposed opposite to the fourth edge, and a corner between the first edge and the fourth edge is curved, wherein the display region comprises a plurality of pixel units and R gate driver on array (GOA) signal lines arranged between the pixel units, and wherein R is a natural number; and a peripheral region comprising a GOA circuit configured to drive the pixel units, wherein the pixel units comprise M columns*N rows of light-emitting devices, M columns*N rows of bottom drive circuits, and M*N anode leads, the anode leads connect the light-emitting devices to the bottom drive circuits, the bottom drive circuits are disposed at lower layers of the light-emitting devices, and both M and N are natural numbers, wherein an interval between adjacent light-emitting devices in the pixel unit is greater than a dimension of the bottom drive circuits corresponding to the adjacent light-emitting devices in the pixel unit, to enable a gap to exist between the pixel units, and wherein the R GOA signal lines are configured to pass through the gaps between the plurality of pixel units in the display region, and to connect the plurality of pixel units to the GOA circuit.

2. The display panel of claim 1, wherein either a) a peripheral region corresponding to the first edge, the second edge, and the third edge comprises all GOA circuits; or b) a peripheral region corresponding to the first edge and the second edge comprises all GOA circuits.

3. The display panel of claim 1, wherein the light-emitting device comprises a light-emitting region and a process redundancy region, and the interval is a distance, in a row direction, between geometrical centers of light-emitting regions in the adjacent light-emitting devices in the pixel unit.

4. The display panel of claim 3, wherein the GOA signal line comprises a first part signal line and a second part signal line, and the first part signal line is connected to the second part signal line, wherein the first part signal line extends in the row direction and passes through the gap between the pixel units, and wherein the second part signal line extends in a column direction and is connected to the GOA circuit.

5. The display panel of claim 4, wherein an included angle of 90° is between a straight line in which the first part signal line is located and a straight line in which the second part signal line is located.

6. The display panel of claim 1, wherein the plurality of pixel units are arranged in S rows, N is a multiple of 2, and R is equal to S*N.

7. The display panel of claim 1, wherein any one of the GOA signal lines passes through gaps between the plurality of pixel units in a pixel unit array in a Z shape, a Ω shape, a zigzag shape, or a curved shape.

8. The display panel of claim 1, wherein the peripheral region comprises a signal providing region adjacent to the fourth edge, wherein a length of the signal providing region is smaller than or equal to a length of the fourth edge, wherein the display region further comprises K data connection lines disposed between the pixel units, and K is a natural number, and wherein the K data connection lines are configured to pass through the gaps between the plurality of pixel units in the display region, and to connect pixel units in Q columns in the plurality of pixel units to the signal providing region, the pixel units in Q columns comprise pixel units corresponding to the corner, and Q is a natural number less than or equal to K.

9. The display panel of claim 8, wherein the pixel units in Q columns further comprise pixel units corresponding to the fourth edge.

10. The display panel of claim 8, wherein any one of the data connection lines comprises a first part connection line connected to a second part connection line, wherein the first part connection line extends in a row direction and passes through the gap between the pixel units, and wherein the second part connection line extends in a column direction and is connected to the signal providing region.

11. The display panel of claim 10, wherein an included angle of 90° is between a straight line in which the first part connection line is located and a straight line in which the second part connection line is located.

12. The display panel of claim 8, wherein the plurality of pixel units are arranged in L columns, N is a multiple of 2, K is equal to Q*M, and the signal providing region comprises L*M signal lines, wherein the pixel units in Q columns extend through the K data connection lines and are connected to K signal lines, and wherein in the pixel units in L columns, pixel units in L columns to Q columns except the pixel units in Q columns extend in a column direction and are connected to L*M−K signal lines.

13. The display panel of claim 1, wherein the display region comprises a second region and a first region disposed around a hole, and the plurality of pixel units comprise a first pixel unit and a second pixel unit, wherein the first region comprises a plurality of first pixel units arranged in columns, wherein the second region comprises a plurality of second pixel units and T data lines arranged between the second pixel units in the second region, wherein T is a natural number, and the plurality of first pixel units in the first region are connected in a column direction to corresponding columns of second pixel units in the second region, wherein the T data lines are configured to pass through gaps between the plurality of second pixel units in the second region, to connect second pixel units in U columns in the second region, and wherein the second pixel units in U columns comprise a plurality of columns of second pixel units whose holes are corresponding to the second region in the column direction, and U is a natural number less than or equal to T.

14. The display panel of claim 13, wherein the hole is configured to have a lens of a camera disposed therein, the first region is configured to have a sensor of the camera disposed therein, and the first region is an under display camera (UDC) region.

15. The display panel of claim 13, wherein any one of the data lines comprises a third part connection line, a fourth part connection line, and a fifth part connection line, and the third part connection line, the fourth part connection line, and the fifth part connection line communicate with each other, wherein connection points between the third part connection line and light-emitting devices in any column are located on a first side of the hole, connection points between the fifth part connection line and the light-emitting devices in any column are located on a second side of the hole, and the first side is opposite to the second side, wherein the third part connection line extends in a row direction and passes through gaps between the second pixel units in the second region, to connect the fourth part connection line, wherein the fourth part connection line extends in the column direction and passes through the gaps between the second pixel units in the second region, to connect the fifth part connection line, and wherein the fifth part connection line extends in the row direction and passes through the gaps between the second pixel units in the second region.

16. The display panel of claim 15, wherein a straight line in which the third part connection line is located and a straight line in which the fourth part connection line is located are connected at an included angle of 90°, and the straight line in which the fourth part connection line is located and a straight line in which the fifth part connection line is located are connected at an included angle of 90°.

17. The display panel of claim 13, wherein N is a multiple of 2, and T is equal to U*M, wherein the second pixel units in U columns are connected by using the T data lines, and wherein in second pixel units in L columns, second pixel units in L columns to U columns except the second pixel units in U columns extend and are connected in the column direction.

18. The display panel of claim 13, wherein any one of the data lines passes through the gaps between the plurality of second pixel units in the second region in a Z shape, a Ω shape, a zigzag shape, or a curved shape.

19. The display panel of claim 13, wherein bottom drive circuits of the first pixel units in the first region are disposed in the peripheral region, light-emitting devices of the first pixel units in the first region are disposed in the first region, and the light-emitting devices of the first pixel units and the bottom drive circuits of the first pixel units are connected by anode leads of a transparent material.

20. A display panel, comprising:

a display region comprising a first edge, a second edge, a third edge, and a fourth edge, wherein the first edge is disposed opposite to the second edge, the third edge is disposed opposite to the fourth edge, and a corner between the first edge and the fourth edge is curved, wherein the display region comprises a plurality of pixel units and R gate driver on array (GOA) signal lines arranged between the pixel units, and wherein R is a natural number; and a peripheral region comprising a GOA circuit configured to drive the pixel units, wherein the pixel units comprise M columns*N rows of light-emitting devices, M columns*N rows of bottom drive circuits, and M*N anode leads, the anode leads connect the light-emitting devices to the bottom drive circuits, the bottom drive circuits are disposed at lower layers of the light-emitting devices, and both M and N are natural numbers, wherein a dimension of a region enclosed by the light-emitting devices in the pixel unit is greater than a dimension of a region enclosed by the bottom drive circuits corresponding to the light-emitting devices in the pixel units, to enable a gap to exist between the pixel units, and wherein the R GOA signal lines are configured to pass through the gaps between the plurality of pixel units in the display region, and to connect the plurality of pixel units to the GOA circuit.

21. A terminal device, comprising:

a display panel, comprising:

a display region comprising a first edge, a second edge, a third edge, and a fourth edge, wherein the first edge is disposed opposite to the second edge, the third edge is disposed opposite to the fourth edge, and a corner between the first edge and the fourth edge is curved, wherein the display region comprises a plurality of pixel units and R gate driver on array (GOA) signal lines arranged between the pixel units, and wherein R is a natural number; and a peripheral region comprising a GOA circuit configured to drive the pixel units, wherein the pixel units comprise M columns * N rows of light-emitting devices, M columns * N rows of bottom drive circuits, and M * N anode leads, the anode leads connect the light-emitting devices to the bottom drive circuits, the bottom drive circuits are disposed at lower layers of the light-emitting devices, and both M and N are natural numbers, wherein an interval between adjacent light-emitting devices in the pixel unit is greater than a dimension of the bottom drive circuits corresponding to the adjacent light-emitting devices in the pixel unit, to enable a gap to exist between the pixel units, and wherein the R GOA signal lines are configured to pass through the gaps between the plurality of pixel units in the display region, and to connect the plurality of pixel units to the GOA circuit; and a processor coupled to the display panel and configured to control the display panel.

* * * * *